(12) United States Patent
Yajima

(10) Patent No.: US 9,496,232 B2
(45) Date of Patent: Nov. 15, 2016

(54) SEMICONDUCTOR DEVICE AND ITS MANUFACTURING METHOD

(71) Applicant: Renesas Electronics Corporation, Tokyo (JP)

(72) Inventor: Akira Yajima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/836,688

(22) Filed: Aug. 26, 2015

(65) Prior Publication Data

US 2016/0064344 A1 Mar. 3, 2016

(30) Foreign Application Priority Data

Aug. 28, 2014 (JP) ................................ 2014-173454

(51) Int. Cl.
*H01L 21/44* (2006.01)
*H01L 23/00* (2006.01)

(52) U.S. Cl.
CPC ............... *H01L 24/03* (2013.01); *H01L 24/05* (2013.01); *H01L 24/09* (2013.01); *H01L 24/43* (2013.01); *H01L 24/49* (2013.01); *H01L 24/45* (2013.01); *H01L 2224/024* (2013.01); *H01L 2224/02166* (2013.01); *H01L 2224/02317* (2013.01); *H01L 2224/02373* (2013.01); *H01L 2224/04042* (2013.01); *H01L 2224/0519* (2013.01); *H01L 2224/43985* (2013.01); *H01L 2224/45139* (2013.01); *H01L 2224/45144* (2013.01); *H01L 2224/45147* (2013.01); *H01L 2224/48463* (2013.01); *H01L 2224/4941* (2013.01)

(58) Field of Classification Search
CPC ..................... H01L 24/03; H01L 24/09; H01L 24/49; H01L 2224/02317; H01L 2224/0519
USPC .......................................................... 438/612
See application file for complete search history.

(56) References Cited

U.S. PATENT DOCUMENTS

| | | | | |
|---|---|---|---|---|
| 5,734,200 A | * | 3/1998 | Hsue ........................ | H01L 24/03 257/751 |
| 6,727,593 B2 | * | 4/2004 | Toyoda ............. | H01L 21/76834 257/762 |
| 7,122,902 B2 | * | 10/2006 | Hatano ............. | H01L 23/53223 257/758 |
| 7,361,993 B2 | * | 4/2008 | Coolbaugh ............. | H01L 24/11 257/737 |
| 8,110,918 B2 | | 2/2012 | Choi | |

(Continued)

FOREIGN PATENT DOCUMENTS

JP 2005-5721 A 1/2005
JP 2012-4210 A 1/2012

*Primary Examiner* — Luan C Thai
(74) *Attorney, Agent, or Firm* — McDermott Will & Emery LLP

(57) ABSTRACT

The present invention makes it possible to: reduce the manufacturing cost of a semiconductor device having a redistribution layer; and further improve the reliability of a semiconductor device having a redistribution layer.
A feature point of First Embodiment is that an opening and a redistribution layer gutter are formed integrally in a polyimide resin film of a single layer as shown in FIG. 5. It is thereby possible to: form a redistribution layer in the polyimide resin film of a single layer; and hence inhibit a wiring material (silver) including the redistribution layer from migrating.

4 Claims, 19 Drawing Sheets

(56) References Cited

U.S. PATENT DOCUMENTS

| | | | |
|---|---|---|---|
| 8,592,977 B2 * | 11/2013 | Chou | ............... H01L 23/53238 |
| | | | 257/751 |
| 8,592,984 B2 | 11/2013 | Shigihara et al. | |
| 9,209,045 B2 * | 12/2015 | Wang | ............... H01L 21/76801 |

* cited by examiner

SEMICONDUCTOR DEVICE AND ITS MANUFACTURING METHOD

CROSS-REFERENCE TO RELATED APPLICATIONS

The disclosure of Japanese Patent Application No. 2014-173454 filed on Aug. 28, 2014 including the specification, drawings and abstract is incorporated herein by reference in its entirety.

BACKGROUND

The present invention relates: to a semiconductor device and its manufacturing technology; and for example to a technology effectively applicable to a semiconductor device having a redistribution layer and its manufacturing technology.

In Japanese Unexamined Patent Application Publication No. 2012-4210 (Patent Literature 1), a technology of inhibiting a pad for external coupling installed in a redistribution layer containing copper (Cu) as the main component from peeling off is described. Concretely, a pad for external coupling to which a wire is coupled is formed integrally so as to cover the top surface and side surface of the redistribution layer. It is thereby said that the contact area between the redistribution layer and the pad for external coupling increases and hence the pad for external coupling is inhibited from peeling off from the redistribution layer.

In Japanese Unexamined Patent Application Publication No. 2005-5721 (Patent Literature 2), a technology of forming a circuit pattern over a wiring substrate by pressing a die to the wiring substrate is described.

CITATION LIST

Patent Literature

Patent Literature 1: Japanese Unexamined Patent Application Publication No. 2012-4210
Patent Literature 2: Japanese Unexamined Patent Application Publication No. 2005-5721

SUMMARY

In a semiconductor device for consumer product application typified by home electronics application and communication application for example, the trends of development are directed to power consumption reduction, downsizing, and cost reduction. Meanwhile, in a semiconductor device for in-vehicle application, in addition to the development trends, the reliability of high voltage operation is required to improve under a high temperature environment. In this regard, from the viewpoint of advancing cost reduction, it has been studied to use an inexpensive copper (Cu) wire instead of an expensive gold (Au) wire. On this occasion, the copper wire is harder than the gold wire and hence is likely to damage a pad to which the wire is coupled. In view of the situation, it has been studied, when a copper wire is used, not to couple the copper wire directly to a pad but to form a redistribution layer including a copper layer to which the pad is coupled and couple the redistribution layer to the copper wire for example.

Even in the case of using an inexpensive copper wire however, since the adhesiveness between the redistribution layer including a copper layer and the copper wire is low, it is difficult to directly couple the redistribution layer to the copper wire. From this, a gold pad is formed over the surface of a redistribution layer and the redistribution layer and a copper wire are coupled with the gold pad interposed. As a result, even though a copper wire itself is inexpensive, the situation is still in the state of being difficult to reduce the manufacturing cost because of the points that a gold pad has to be formed and also a photosensitive polyimide film has to be used and a plurality of photolithography processes (exposure/development processes) have to be carried out when a redistribution layer is formed. In a semiconductor device for consumer product application in particular, further reduction of a manufacturing cost is desired from the viewpoint of improving cost competitiveness and, when a current redistribution layer is used for a semiconductor device for in-vehicle application, room for improvement exists from the viewpoint of the reliability in high voltage operation exceeding 60 V for example. Consequently, in a current redistribution layer, room for improvement exists from the viewpoints of cost reduction and the improvement of the reliability in high voltage operation. That is, a semiconductor device having a redistribution layer is further required to attain cost reduction and the improvement of the reliability in high voltage operation.

Other problems and novel features will be obvious from the descriptions and attached drawings in the present specification.

A semiconductor device according to an embodiment is provided with: a protective insulating film; a redistribution layer gutter formed integrally with an opening in the protective insulating film; and a redistribution layer embedded into the opening and the redistribution layer gutter and coupled electrically to a pad.

Further, a manufacturing method of a semiconductor device according to an embodiment includes the processes of: pressing a mold in which a first protrusion and a second protrusion are formed to a protective insulating film; and integrally forming an opening corresponding to the first protrusion and a redistribution layer gutter corresponding to the second protrusion and communicating with the opening in the protective insulating film.

According to an embodiment, it is possible to reduce the manufacturing cost of a semiconductor device having a redistribution layer. Further, it is possible to improve the reliability of a semiconductor device having a redistribution layer.

DETAILED DESCRIPTION

In the following embodiments, if necessary for convenience sake, each of the embodiments is explained by dividing it into plural sections or embodiments but, unless otherwise specified, they are not unrelated to each other and are in the relationship of one being a modified example, a detail, a supplemental explanation, or the like of a part or the whole of another.

Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Furthermore in the following embodiments, it goes without saying that the constituent components (including a component step and others) are not necessarily essential except the cases of being specified and being obviously thought to be essential in principle and other cases.

Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the numerical value and the range.

Further, in all the drawings for explaining the embodiments, an identical member is represented with an identical code in principle and is not explained repeatedly.

First Embodiment

Explanation on Related Technology

Firstly, before technological thought according to First Embodiment is explained, a redistribution layer structure in a related technology is explained and the room for improvement existing in the related technology is explained.

Figure 1:
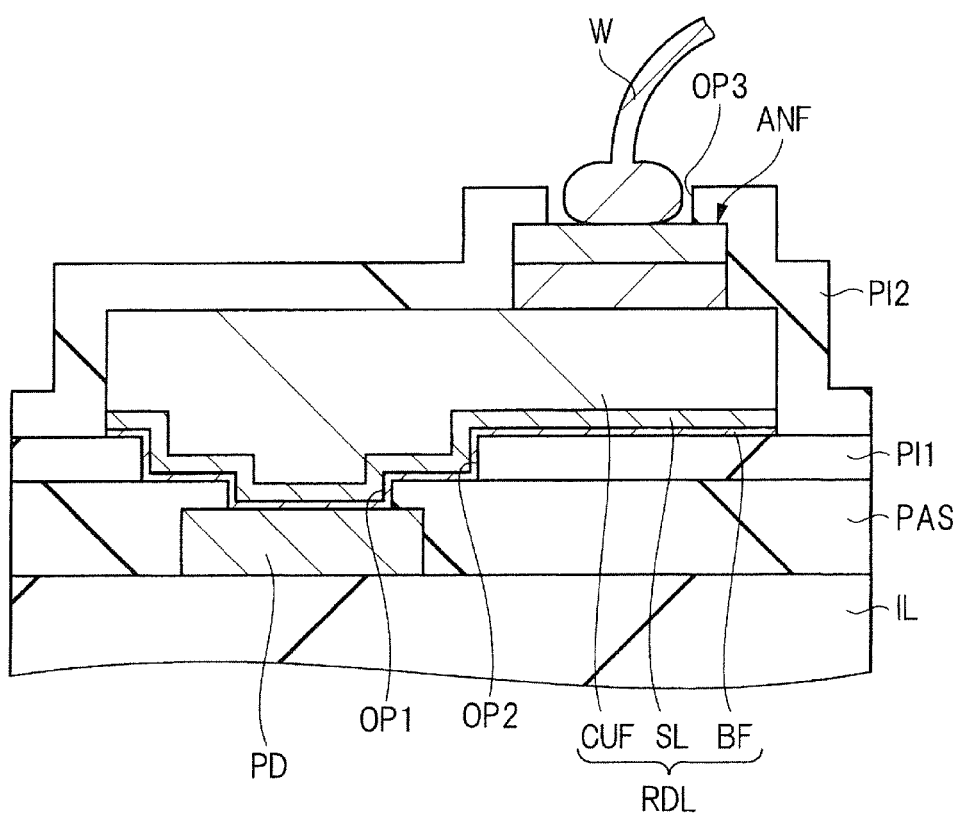
FIG. 1 is a schematic sectional view showing a redistribution layer structure in a related technology.

FIG. 1 is a schematic sectional view showing a redistribution layer structure in a related technology. In FIG. 1, for example, a multilayered wiring layer is formed under an interlayer insulating film IL and further a semiconductor substrate over which a field effect transistor is formed exists under the multilayered wiring layer but they are omitted in FIG. 1.

As shown in FIG. 1, a pad PD is formed over the interlayer insulating film IL and a surface protective film PAS is formed over the interlayer insulating film IL covering the pad PD. Then an opening OP1 is formed in the surface protective film PAS and the surface of the pad PD is exposed through the opening OP1. Successively, as shown in FIG. 1, a polyimide resin film PI1 functioning as a protective insulating film is formed over the surface protective film PAS and an opening OP2 is formed in the polyimide resin film PI1. On this occasion, the opening OP2 formed in the polyimide resin film PI1 communicates with the opening OP1 formed in the surface protective film PAS.

Successively, as shown in FIG. 1, a redistribution layer RDL is formed over the surface of the pad PD exposed through the opening OP1, the side surface of the opening OP1, the inner wall (bottom surface and side surface) of the opening OP2, and the polyimide resin film PI1. The redistribution layer RDL includes a barrier film BF, a seed layer (copper film) SL, and a copper film CUF for example. Then an Au/Ni laminated film ANF including a nickel film and a gold film is formed over a partial region of the surface of the redistribution layer RDL for example and a polyimide resin film PI2 is formed so as to cover the surfaces of the Au/Ni laminated film ANF and the redistribution layer RDL. Further, an opening OP3 is formed in the polyimide resin film PI2 and a wire W is coupled to the Au/Ni laminated film ANF exposed through the opening OP3. In this way, a redistribution layer structure in the related technology is formed.

<Room for Improvement>

Figure 2:
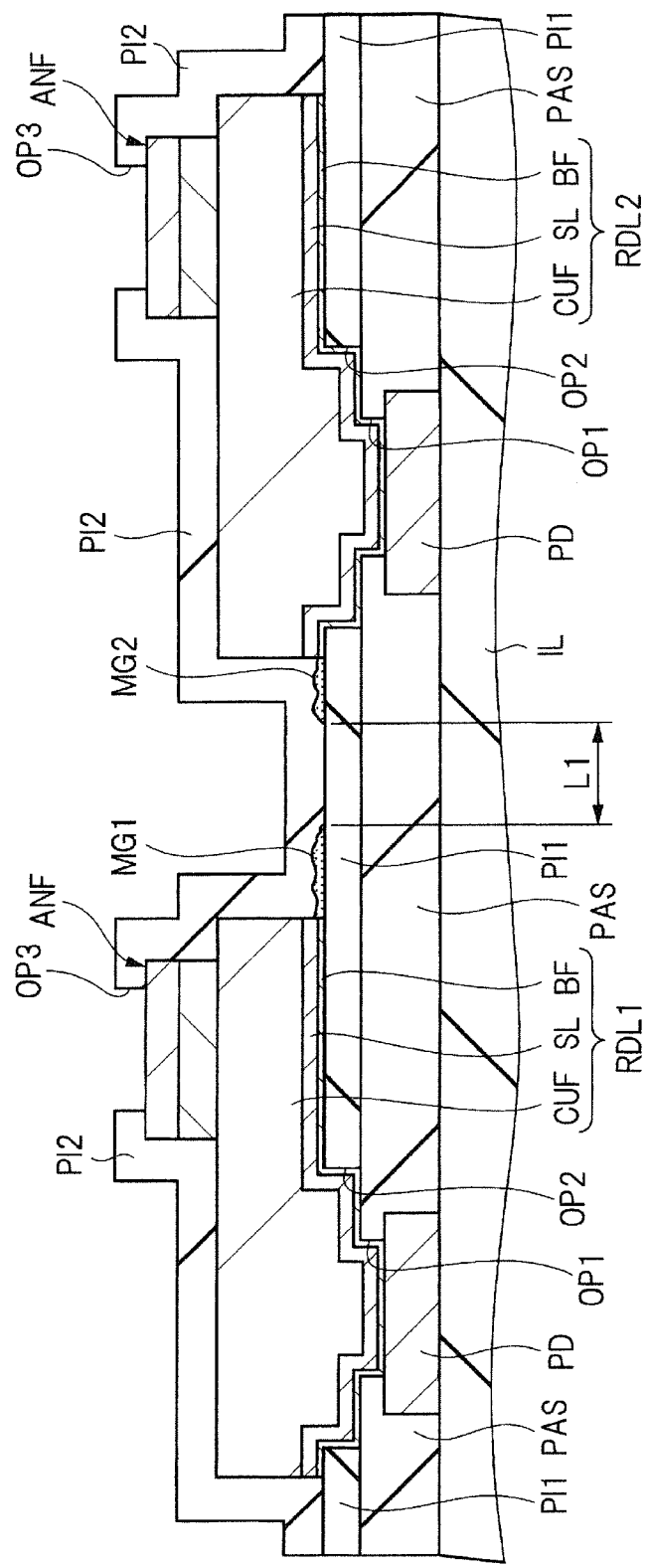
FIG. 2 is a view for explaining first room for improvement existing in a related technology and showing redistribution layers arranged so as to be adjacent to each other.

Room for improvement existing in the related technology is explained hereunder. FIG. 2 is a view for explaining first room for improvement existing in the related technology and a view showing a redistribution layer RDL1 and a redistribution layer RDL2 arranged so as to be adjacent to each other. As shown in FIG. 2, in the related technology for example, a migration MG1 of copper is likely to be generated along the interface between a polyimide resin film PI1 and a polyimide resin film PI2 because a barrier film BF to prevent copper from diffusing does not exist over the side surface of the redistribution layer RDL1. Likewise, a migration MG2 of copper is likely to be generated along the interface between the polyimide resin film PI1 and the polyimide resin film PI2 because a barrier film BF to prevent copper from diffusing does not exist also over the side surface of the redistribution layer RDL2. As a result, the insulation distance between the redistribution layer RDL1 and the redistribution layer RDL2 comes to be a distance L1 shorter than the distance between the redistribution layer RDL1 and the redistribution layer RDL2. That means that the withstand voltage between the redistribution layer RDL1 and the redistribution layer RDL2 lowers. In the related technology therefore, the withstand voltage lowers between the redistribution layer RDL1 and the redistribution layer RDL2, those being adjacent to each other, by the migration of copper along the interface between the polyimide resin film PI1 and the polyimide resin film PI2. As a result, in the related technology, the reliability of a semiconductor device lowers.

Second room for improvement existing in the related technology is explained hereunder. In FIG. 1, in the related technology, the redistribution layer RDL mainly includes the copper film CUF. On this occasion, when a wire W including inexpensive copper is used for example, because the adhesiveness of the wire W including copper and the copper film CUF including the redistribution layer RDL is low, it is difficult to couple the wire W directly to the redistribution layer RDL. To cope with that, in the related technology for example, as shown in FIG. 1, a configuration of forming the Au/Ni laminated film ANF over the redistribution layer RDL and coupling the wire W including copper to the Au/Ni laminated film ANF is adopted. As a result, the coupling reliability (adhesiveness) of the wire W can be improved but the manufacturing cost of a semiconductor device increases because an expensive gold film is used for the Au/Ni laminated film ANF. That is, even when a wire W including inexpensive copper is adopted instead of a wire W including expensive gold from the viewpoint of reducing a manufacturing cost, in the related technology, an Au/Ni laminated film ANF has to be formed over a redistribution layer RDL and hence it has been difficult to sufficiently reduce the manufacturing cost of a semiconductor device.

Further, in the related technology, it is difficult to reduce the manufacturing cost of a semiconductor device also from the fact that a photolithography technology is used much at the manufacturing process of a redistribution layer structure.

Figure 3:
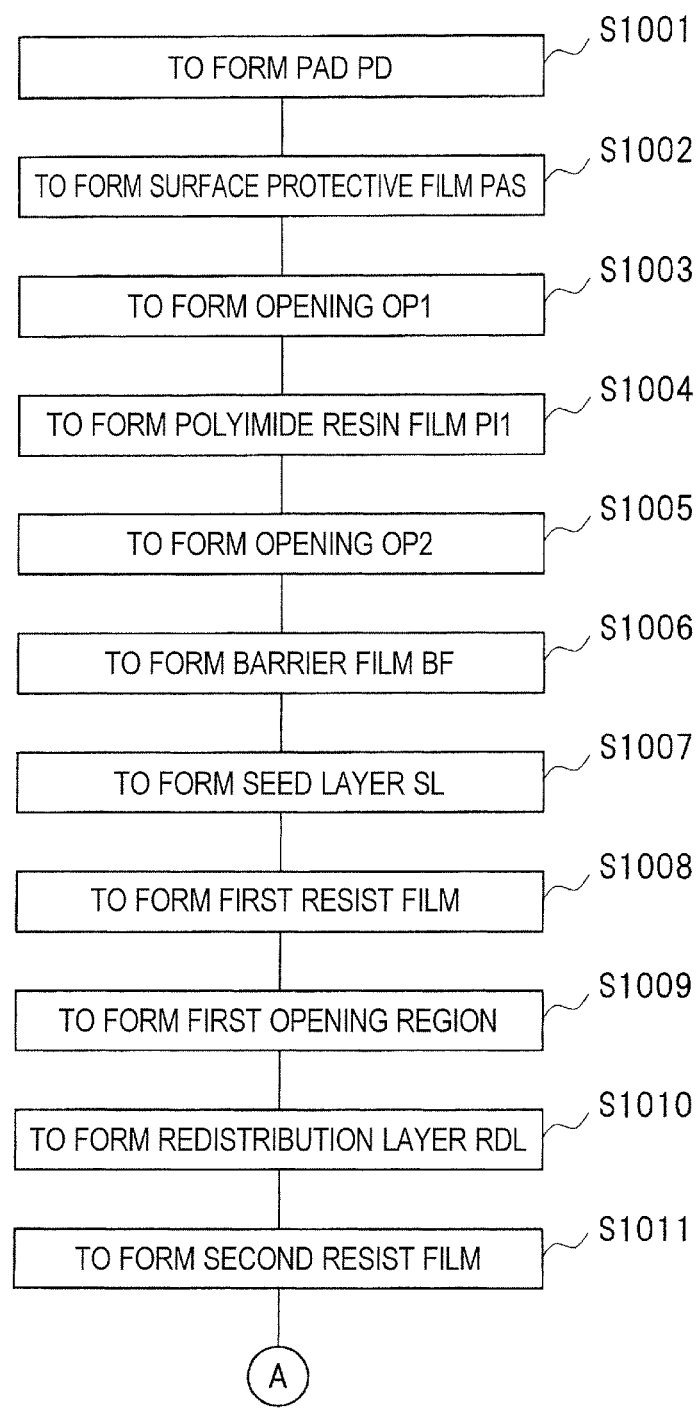
FIG. 3 is a flowchart showing the flow of the manufacturing process of a redistribution layer structure in a related technology.
Figure 4:
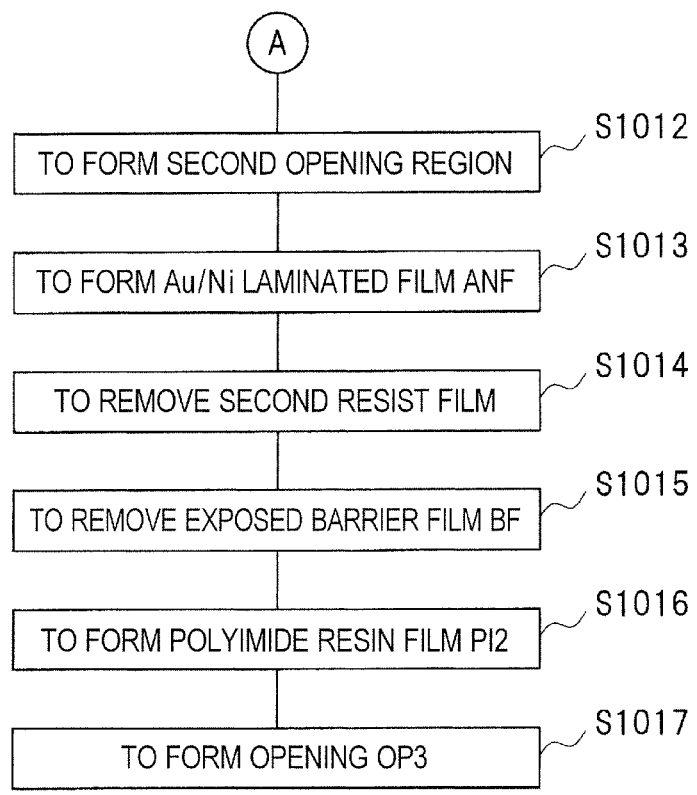
FIG. 4 is a flowchart showing the flow of the manufacturing process of a redistribution layer structure in a related technology.

This point is concretely explained hereunder. FIGS. 3 and 4 are flowcharts showing the flow of the manufacturing process of a redistribution layer structure in the related technology. As shown in FIG. 3, firstly, after a conductive film is formed over an interlayer insulating film IL, the conductive film is patterned and a pad PD is formed by a photolithography technology and an etching technology (S1001).

Successively, after a surface protective film PAS is formed so as to cover the pad PD (S1002), an opening OP1 is formed in the surface protective film PAS by a photolithography technology and an etching technology (S1003).

Then a photosensitive polyimide resin film PI1 is formed over the surface protective film PAS including the interior of the opening OP1 (S1004) and an opening OP2 is formed in the polyimide resin film PI1 by a photolithography technology (S1005).

Successively, a barrier film BF is formed over the surface of the pad PD, the side surface of the opening OP1, the inner wall (bottom surface and side surface) of the opening OP2, and the surface of the polyimide resin film PI1 by a sputtering method (S1006).

Successively, by sputtering methods, a seed layer SL is formed over the barrier film BF (S1007) and a first resist film is formed over the seed layer SL (S1008).

Then a first opening region is formed in the first resist film by a photolithography technology (S1009) and a redistribution layer RDL is formed in the first opening region by an electrolytic plating method for example (S1010).

Successively, after the first resist film is removed, a second resist film is formed so as to cover the redistribution layer RDL (S1011). Then as shown in FIG. 4, a second opening region is formed in the second resist film by a photolithography technology (S1012).

Successively, after an Au/Ni laminated film ANF is formed in the second opening region by an electrolytic plating method for example (S1013), the second resist film is removed (S1014). Then after the exposed barrier film BF is removed (S1015), a photosensitive polyimide resin film PI2 is formed so as to cover the redistribution layer RDL and the Au/Ni laminated film ANF (S1016).

Successively, an opening OP3 is formed in the polyimide resin film PI2 by a photolithography technology (S1017).

In this way, a redistribution layer structure in the related technology can be manufactured. Here, at the manufacturing process of a redistribution layer structure in the related technology, a photolithography technology is used much and hence it is difficult to reduce the manufacturing cost of a semiconductor device.

In view of the above situation, in the related technology, a first room for improvement exists on the point that a withstand voltage lowers between redistribution layers adjacent to each other and a second room for improvement exists on the point that the manufacturing cost increases by the synergetic factors of using an Au/Ni laminated film ANF and much using a photolithography technology at the manufacturing process. That is, in the related technology, room for improvement exists from both the viewpoints of improving the reliability of a semiconductor device and reducing the manufacturing cost of a semiconductor device. In First Embodiment therefore, ingenuity is exercised in the room for improvement existing in the related technology. The technological thought of First Embodiment in which ingenuity is exercised is explained hereunder.

<Device Structure According to First Embodiment>

Figure 5:
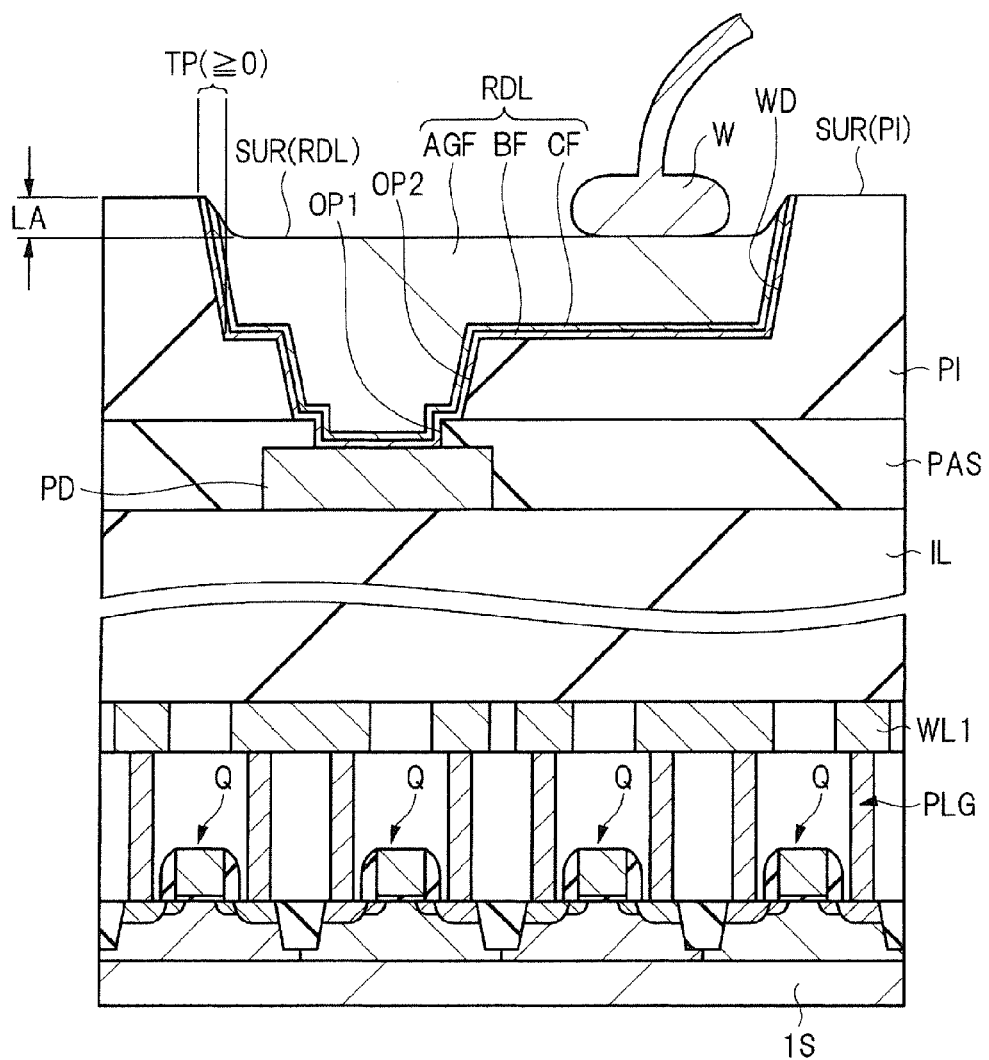
FIG. 5 is a sectional view showing an example of the device structure of a semiconductor device according to First Embodiment.

FIG. 5 is a sectional view showing an example of the device structure of a semiconductor device according to First Embodiment. As shown in FIG. 5, a plurality of field effect transistors Q including an integrated circuit are formed over the principal surface of a semiconductor substrate 1S including silicon for example. Then an interlayer insulating film is formed so as to cover the field effect transistors Q and plugs PLG penetrating the interlayer insulating film and being electrically coupled to the field effect transistors Q are formed. Then wiring layers WL1 are formed by a damascene method over the interlayer insulating film in which the plugs PLG are formed for example. The wiring layers WL1 are electrically coupled to the field effect transistors Q though the plugs PLG. Here, although it is not shown in FIG. 5, a multilayered wiring layer is formed over the wiring layers WL1 and an interlayer insulating film IL that is the uppermost layer is formed so as to cover the multilayered wiring layer.

Then as shown in FIG. 5, a pad PD including an aluminum alloy film is formed over the interlayer insulating film IL for example. That is, the pad PD is formed above the semiconductor substrate 1S and a surface protective film PAS including a silicon oxide film or a silicon nitride film is formed so as to cover the pad PD for example. An opening OP1 is formed in the surface protective film PAS and a partial region of the surface of the pad PD is exposed at the bottom of the opening OP1.

Successively, as shown in FIG. 5, a polyimide resin film PI is formed over the surface protective film PAS and a redistribution layer gutter WD and an opening OP2 are formed integrally in the polyimide resin film PI. On this occasion, the opening OP2 formed in the polyimide resin film PI: is formed so as to communicate with the opening OP1 formed in the surface protective film PAS; and communicates also with the redistribution layer gutter WD formed in the polyimide resin film PI.

Successively, a barrier film BF is formed over the surface of the pad PD exposed through the opening OP1, the side surface of the opening OP1, the inner wall (bottom surface and side surface) of the opening OP2, and the inner wall (bottom surface and side surface) of the redistribution layer gutter WD. Then an adhesive film CF is formed over the barrier film BF and further a silver film AGF is formed over the adhesive film CF so as to fill the opening OP1, the opening OP2, and the redistribution layer gutter WD. In this way, a redistribution layer RDL including the barrier film BF, the adhesive film CF, and the silver film AGF is formed over the interiors of the opening OP1, the opening OP2, and the redistribution layer gutter WD. Then a wire W containing copper as the main component is coupled to the surface of the redistribution layer RDL for example.

Here, a "main component" described in the present specification means a material component contained most in the constituent material including a member and for example a "material containing copper as the main component" means that the material of the member contains copper most. In the present specification, the term "main component" is used with the intention of expressing that a member basically includes copper but the case of containing another impurity is not excluded for example.

The material of the redistribution layer RDL is explained hereunder. The redistribution layer RDL includes the barrier film BF, the adhesive film CF, and the silver film AGF and hence the materials of the respective films are explained.

Firstly, the barrier film BF includes a film having the function of inhibiting a wiring material including the redistribution layer RDL from migrating into the polyimide resin film PI. The barrier film BF can include a titanium (Ti) film, a titanium nitride (TiN) film, a titanium tungsten (TiW) film, a chromium (Cr) film, a tantalum (Ta) film, a tungsten (W) film, a tungsten nitride (WN) film, a high-melting-point metal film, a precious metal (Pd, Ru, Pt, Ni, or the like) film for example.

On this occasion, a desirable film thickness is 100 nm or more in the case of a titanium film and 50 nm or more in the case of a titanium nitride film or a titanium tungsten film. Further, a desirable film thickness is 50 nm or more in the case of a chromium film and 20 nm or more in the case of a tantalum film, a tungsten film, or a tungsten nitride film. Furthermore, a desirable film thickness is 50 nm or more in the case of a high-melting-point metal film or a precious metal film.

Successively, the adhesive film CF has the function of improving the adhesiveness between the barrier film BF and the silver film AGF and can include a copper film or a copper alloy film, those containing copper as the main component, for example. Further, the silver film AGF can include a silver film containing silver as the main component or a silver alloy (Sn based, Au based, or Pd based) film.

Here, the film thickness of the redistribution layer RDL is about 3 to 20 μm and the layer width of the redistribution layer RDL is about 4 to 100 μm, for example.

<Features (Device Structure) According to First Embodiment>

The feature points of First Embodiment are explained hereunder. Firstly, the first feature point of First Embodiment is, as shown in FIG. 5, that the opening OP2 and the redistribution layer gutter WD are formed integrally in the polyimide resin film PI of a single layer. As a result, it is possible to: form the redistribution layer RDL in the polyimide resin film PI of a single layer; and hence inhibit the wiring material (silver) including the redistribution layer RDL from migrating. Here, a "wiring material" including a redistribution layer RDL described in the present specification indicates a wiring material (silver) of a silver film AGF that is the primal film of the redistribution layer RDL, unless otherwise specified.

In the related technology shown in FIG. 1, the redistribution layer RDL is formed in the laminated film of the polyimide resin film PI1 and the polyimide resin film PI2. On this occasion, since an interface exists inevitably between the polyimide resin film PI1 and the polyimide resin film PI2, the potential of diffusing (migrating) the wiring material (copper) including the redistribution layer RDL along the interface increases. That is, in the related technology, the migration of the wiring material along the interface becomes obvious as room for improvement due to the structure of forming the redistribution layer RDL in the laminated film of the polyimide resin film PI1 and the polyimide resin film PI2.

In contrast, in First Embodiment, as shown in FIG. 5, the redistribution layer RDL is formed in the polyimide resin film PI of a single layer. This means that, by the redistribution layer structure according to First Embodiment, the "existence of an interface" caused by adopting the double-layered polyimide resin film is avoided and resultantly it is possible to eliminate the potential of generating the migration of the wiring material along the "interface". That is, since an "interface" extending from the bottom surface of the redistribution layer gutter WD does not exist in the polyimide resin film PI according to First Embodiment, it is possible to eliminate the potential of generating the migration of the wiring material along the "interface". According to First Embodiment therefore, it is possible to improve the withstand voltage between the redistribution layers RDL adjacent to each other by the migration of the wiring material including the redistribution layers RDL. As a result, according to First Embodiment, it is possible to improve the reliability of a semiconductor device.

Successively, the second feature point of First Embodiment is, as shown in FIG. 5, that the barrier film BF is formed up to the side surface of the redistribution layer gutter WD. In First Embodiment, an "interface" itself causing the migration of a wiring material to be generated does not exist by the first feature point of integrally forming the opening OP2 and the redistribution layer gutter WD in the polyimide resin film PI of a single layer as stated above and hence it is possible to improve the withstand voltage between the redistribution layers RDL adjacent to each other.

In the case where the wiring material of the redistribution layer RDL directly touches the polyimide resin film PI however, even though an "interface" itself does not exist, the potential of migrating the wiring material of the redistribution layer RDL into the interior of the polyimide resin film PI exists. On this occasion, the withstand voltage between the redistribution layers RDL adjacent to each other may possibly lower by the migration of the wiring material including the redistribution layers RDL. In the related technology in particular, as shown in FIG. 1, the "interface" exists between the polyimide resin film PI1 and the polyimide resin film PI2 and the side surface of the redistribution layer RDL directly touches the polyimide resin film PI2. In other words, a barrier film BF is not formed over the side surface of the redistribution layer RDL. In the related technology therefore, by the first factor of the existence of the "interface" between the polyimide resin film PI1 and the polyimide resin film PI2 and the second factor of not forming a barrier film BF over the side surface of the redistribution layer RDL, the potential of lowering the withstand voltage between the redistribution layers RDL adjacent to each other increases.

On this point, as shown in FIG. 5, First Embodiment has the first feature point of integrally forming the opening OP2 and the redistribution layer gutter WD in the polyimide resin film PI of a single layer and in addition the second feature point of forming the barrier film BF also over the side surface of the redistribution layer gutter WD. According to First Embodiment therefore, it is possible to effectively inhibit the wiring material including the redistribution layer RDL from migrating into the polyimide resin film PI by the synergistic effect of the first feature point and the second feature point. According to First Embodiment therefore, it is possible to: improve the withstand voltage between the redistribution layers RDL adjacent to each other; and thereby significantly improve the reliability of a semiconductor device. In the case of applying the technological thought in First Embodiment to an in-vehicle semiconductor device therefore, it is possible to ensure the reliability of high voltage operation exceeding 60 V for example.

Figure 6:
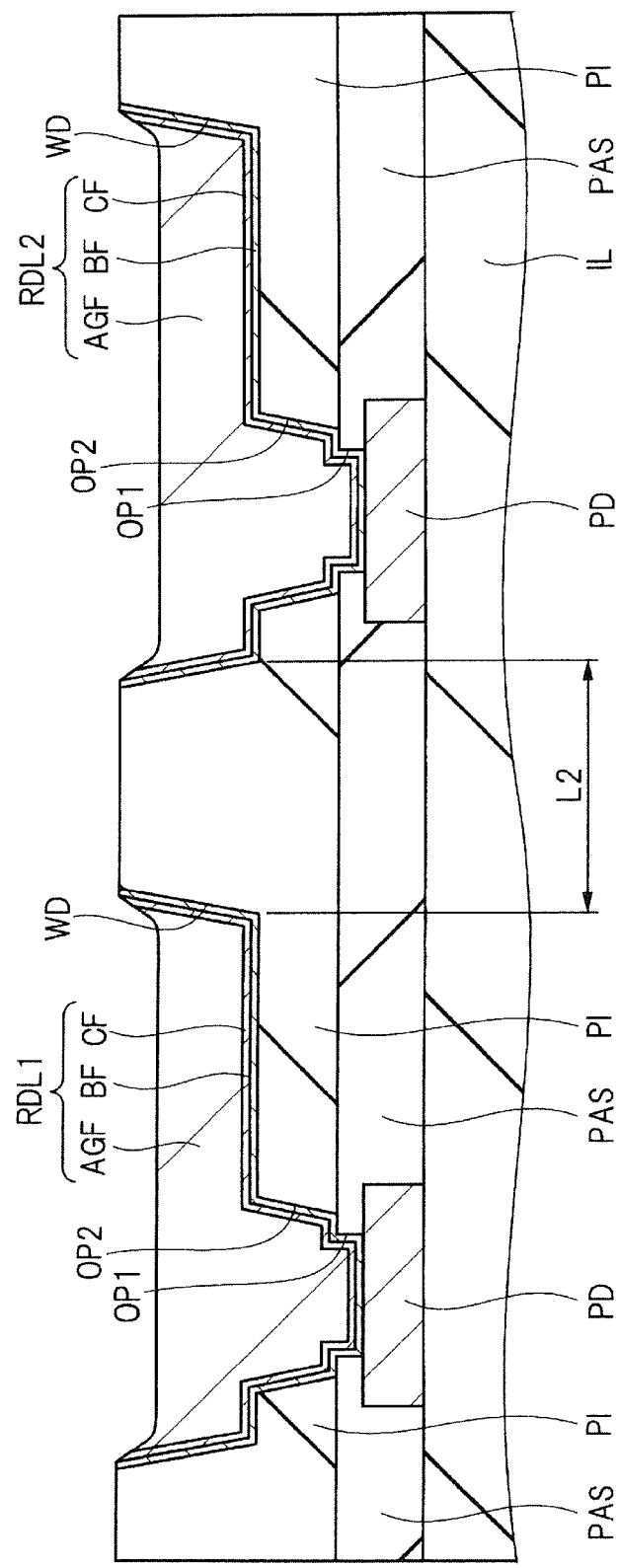
FIG. 6 is a view showing redistribution layers arranged so as to be adjacent to each other in First Embodiment.

Further, the third feature point of First Embodiment is, as shown in FIG. 5, that the side surface of the redistribution layer gutter WD inclines so as to form a positive taper. According to First Embodiment therefore, it is possible to improve the withstand voltage between the redistribution layers RDL adjacent to each other. For example, FIG. 6 is a view showing a redistribution layer RDL1 and a redistribution layer RDL2, those being arranged so as to be adjacent to each other in First Embodiment. As shown in FIG. 6, since the side surface of each of the redistribution layer gutters WD inclines so as to form a positive taper, it is possible to increase the distance L2 between the redistribution layer RDL1 and the redistribution layer RDL2. That is, according to the third feature point of First Embodiment, it is possible to increase the distance L2 between the redistribution layer RDL1 and the redistribution layer RDL2 more than the case of forming the side surface of each of the redistribution layer gutters WD vertically. Then the increase of the distance L2 between the redistribution layer RDL1 and the redistribution layer RDL2 means that the withstand voltage between the redistribution layer RDL1 and the redistribution layer RDL2, those being adjacent to each other, can be improved and hence it is possible to improve the reliability of a semiconductor device by the third feature point of First Embodiment. According to First Embodiment therefore, by the synergistic effect of the first feature point, the second feature point, and the third feature point, it is possible to: improve the withstand voltage of a semiconductor device; and resultantly improve the reliability of a semiconductor device. Here, the third feature point of First Embodiment is that, by inclining the side surface of each of the redistribution layer gutters WD so as to form a positive taper without changing the layout of the redistribution layer RDL1 and the redistribution layer RDL2, it is possible to increase the distance L2 between the redistribution layer RDL1 and the redistribution layer RDL2 more than the case of processing the side surface of each of the redistribution layer gutters WD vertically. On this occasion, it is possible to improve the withstand voltage between the redistribution layer RDL1 and the redistribution layer RDL2, those being adjacent to each other, as stated above. To put it the other way, by the third feature point of First Embodiment, when a withstand voltage comparable to the case of processing the side surface of each of the redistribution layer gutters WD vertically is sufficient, it is possible to: shrink the layout of the redistribution layer RDL1 and the redistribution layer RDL2; and thereby try to miniaturize a semiconductor device. That is, according to the third feature point of First Embodiment, it is possible to materialize a configuration allowing withstand voltage to improve without changing the layout arrangement of the redistribution layer RDL1 and the redistribution layer RDL2 and, on the other hand, when a sufficient withstand voltage is ensured currently, it is possible to materialize a configuration allowing the layout arrangement of the redistribution layer RDL1 and the redistribution layer RDL2 to shrink.

Successively, the fourth feature point of First Embodiment is, as shown in FIG. 5, that the adhesive film CF is interposed between the barrier film BF and the silver film AGF in the redistribution layer RDL. The adhesiveness of the redistribution layer RDL thereby improves and hence it is possible to prevent a gap caused by the exfoliation of the redistribution layer RDL from being generated between the redistribution layer RDL and the polyimide resin film PI. This means that it is possible to inhibit the corrosion of the redistribution layer RDL caused by the intrusion of moisture or the like into the gap and the migration of the wiring material through the moisture and, as a result, it is possible to improve the reliability of a semiconductor device by the fourth feature point of First Embodiment.

Successively, the fifth feature point of First Embodiment is, as shown in FIG. 5, that the height of the surface SUR(RDL) of the redistribution layer RDL is lower than the height of the surface SUR(PI) of the polyimide resin film PI. Concretely, as shown in FIG. 5, the difference LA between the height of the surface SUR(RDL) of the redistribution layer RDL and the height of the surface SUR(PI) of the polyimide resin film PI is about 500 nm. As a result, it is possible to inhibit the wiring material from migrating from the surface SUR(RDL) of the redistribution layer RDL to the surface SUR(PI) of the polyimide resin film PI. That is, by the fifth feature point of First Embodiment, a level difference (barrier) is formed between the surface SUR(RDL) of the redistribution layer RDL and the surface SUR(PI) of the polyimide resin film PI. As a result, the wiring material is hindered by the level difference from migrating from the surface SUR(RDL) of the redistribution layer RDL to the surface SUR(PI) of the polyimide resin film PI. According to First Embodiment therefore, it is possible to inhibit the deterioration of withstand voltage (deterioration of reliability) of a semiconductor device caused by the migration of the wiring material.

Successively, the sixth feature point of First Embodiment is, as shown in FIG. 5, that the surface SUR(RDL) of the redistribution layer RDL is exposed through the polyimide resin film PI. On this occasion, it is possible to couple a wire W to an arbitrary region of the surface SUR(RDL) of the redistribution layer RDL. This means that the degree of freedom in the coupling of a wire W improves and thereby the flexibility of a semiconductor device can improve. That is, by the sixth feature point of First Embodiment, it is possible to carry out the layout design of the redistribution layer RDL without being affected by the coupling position of the wire W. That is, by the sixth feature point of First Embodiment, it is possible to improve the degree of freedom in the layout design of the redistribution layer RDL and thereby, almost regardless of the coupling position of the wire W, it is possible to expand the degree of freedom in the layout design corresponding to an object such as a layout arrangement specified in the performance improvement of a semiconductor device or a layout arrangement specified in the downsizing (shrinking) of a semiconductor device.

Successively, the seventh feature point of First Embodiment is that the primal film including the redistribution layer RDL includes the silver film AGF. It is thereby possible to couple the wire W containing copper as the main component directly to the silver film AGF exposed at the surface of the redistribution layer RDL for example. That is, the adhesiveness between silver that is the main component of the silver film AGF and the wire W containing copper as the main component is good and hence it is unnecessary to form an Au/Ni laminated film ANF between the redistribution layer RDL and the wire W unlike the related technology. According to First Embodiment therefore, it is possible to reduce the manufacturing cost of a semiconductor device by the synergistic effect of: being able to use the wire W containing inexpensive copper as the main component; not using a gold film contained in an Au/Ni laminated film ANF; and being unnecessary to add a process for manufacturing an Au/Ni laminated film ANF.

Further, by the seventh feature point of First Embodiment, because the film exposed at the surface of the redistribution layer RDL is the silver film AGF, it can be directly coupled not only to a wire W containing copper as the main component but also to a wire W containing gold as the main component and a wire W containing silver as the main component. By the seventh feature point of First Embodiment therefore, even in the case of using not only a wire W containing copper as the main component but also a wire W containing gold as the main component and a wire W containing silver as the main component, the redistribution layer RDL and the wire W can be coupled directly. By the seventh feature point of First Embodiment therefore, it is unnecessary to interpose a wire coupling conductive film between the redistribution layer RDL and the wire W in order to improve coupling reliability between the redistribution layer RDL and the wire W and it is possible to improve the degree of freedom in the choice of a wire W while the manufacturing cost of a semiconductor device is inhibited from increasing.

From this, according to First Embodiment, by the sixth feature point and the seventh feature point of First Embodiment, it is possible to try to improve the degree of freedom in the layout of a semiconductor device and the degree of freedom in the choice of a wire W. That is, it is obvious that the technology in First Embodiment is a highly versatile technology on the point that a redistribution layer structure applicable to semiconductor devices of various applications (types) can be provided at a low cost and the technological thought of First Embodiment is a useful technological thought excellent in versatility.

<Manufacturing Method of Semiconductor Device According to First Embodiment>

A semiconductor device according to First Embodiment is configured as stated above and a manufacturing method of the semiconductor device is explained hereunder in reference to drawings. In the following explanations, firstly the outline of the manufacturing method of a semiconductor device according to First Embodiment is explained by using a flowchart and secondly the manufacturing method of the semiconductor device according to First Embodiment is explained by using schematic sectional views.

Figure 7:
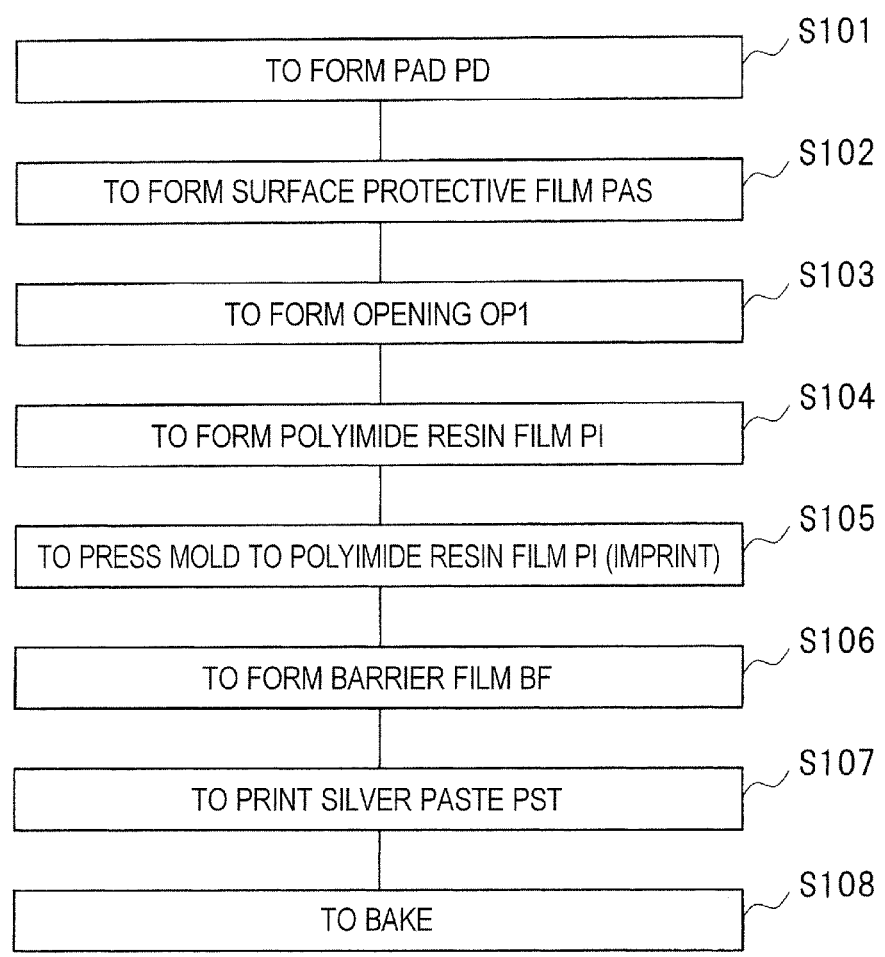
FIG. 7 is a flowchart showing the flow of the manufacturing process of a semiconductor device according to First Embodiment.

FIG. 7 is a flowchart showing the flow of the manufacturing process of a semiconductor device according to First Embodiment. In the manufacturing method of a semiconductor device according to First Embodiment shown in FIG. 7, firstly a pad PD including an aluminum film or an aluminum alloy film is formed for example (S101). Successively, a surface protective film PAS including a silicon oxide film or a silicon nitride film is formed so as to cover the pad PD (S102) and an opening OP1 is formed in the surface protective film PAS by a photolithography technology and an etching technology for example (S103). On this occasion, a partial region of the surface of the pad PD is exposed at the bottom of the opening OP1.

Successively, a polyimide resin film PI is formed over the surface protective film PAS including the interior of the opening OP1 (S104). The polyimide resin film PI here is not necessarily a photosensitive polyimide resin film PI and an opening OP2 and a redistribution layer gutter WD are formed integrally in the polyimide resin film PI by an imprinting technology (S105). Concretely, a mold PAT in which a first protrusion and a second protrusion are formed is pressed to the polyimide resin film PI and the opening OP2 corresponding to the first protrusion and communicating with the opening OP1 and the redistribution layer gutter WD corresponding to the second protrusion and communicating with the opening OP2 are formed integrally in the polyimide resin film PI.

Figure 8:
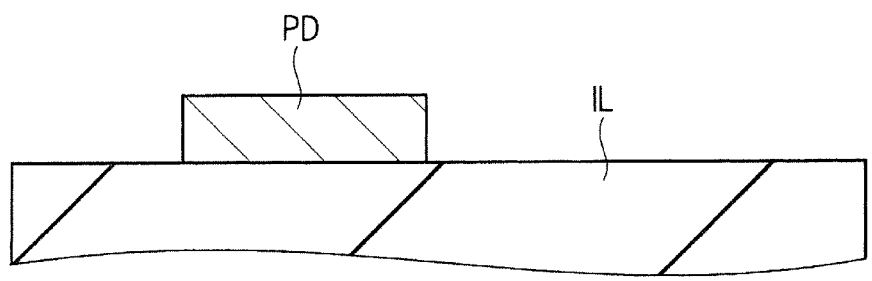
FIG. 8 is a sectional view showing a semiconductor device during a manufacturing process according to First Embodiment.

Successively, a barrier film BF is formed over the surface of the pad PD exposed through the opening OP1, the side surface of the opening OP1, the inner wall (bottom surface and side surface) of the opening OP2, the inner wall (bottom surface and side surface) of the redistribution layer gutter WD, and the surface of the polyimide resin film PI (S106). Successively, a silver paste PST is formed over the barrier film BF so as to fill the opening OP1, the opening OP2, and the redistribution layer gutter WD by a printing method (S107). Then a silver film AGF is formed from the silver paste PST by heating (baking) a semiconductor substrate. In this way, it is possible to form a redistribution layer structure according to First Embodiment. Here for example, the flowcharts (FIGS. 3 and 4) showing the flow of the manufacturing process for forming the redistribution layer structure according to the related technology and the flowchart (FIG. 7) showing the flow of the manufacturing process for forming the redistribution layer structure according to First Embodiment are compared. On this occasion, as it is obvious from the FIGS. 3 and 4 and FIG. 7, the number of the processes in the manufacturing process of the redistribution layer structure according to First Embodiment is significantly reduced in comparison with the manufacturing process of the redistribution layer structure according to the related technology. Concretely, whereas 17 processes are required for the manufacturing of the redistribution layer structure according to the related technology as shown in FIGS. 3 and 4, 8 processes are required for the manufacturing of the redistribution layer structure according to First Embodiment as shown in FIG. 7. That is, the number of the processes according to First Embodiment is reduced to not more than half of the number of the processes according to the related technology. As a result, by the manufacturing method of a semiconductor device according to First Embodiment, it is possible to reduce the manufacturing cost of a semiconductor device. In First Embodiment in particular, the number of the processes is tried to be reduced by using an imprinting technology and a printing technology in place of a photolithography technology (exposure/development). According to First Embodiment therefore, it is possible to: significantly reduce the number of the processes; and thereby reduce the manufacturing cost of a semiconductor device, in comparison with the related technology.

The manufacturing process of a semiconductor device according to First Embodiment is explained hereunder by using schematic sectional views. Firstly, s semiconductor substrate including silicon is prepared and a plurality of field effect transistors are formed over the semiconductor substrate for example. Successively, a multilayered wiring layer is formed over the semiconductor substrate over which the field effect transistors are formed. In FIG. 8, an interlayer insulating film IL formed as the uppermost layer of the multilayered wiring layer is shown. As shown in FIG. 8, a conductive film including an aluminum film or an aluminum alloy film (an AlSi film, an AlSiCu film, or the like) is formed over the interlayer insulating film IL and a pad PD is formed by patterning the conductive film by a photolithography technology and an etching technology for example.

Figure 9:
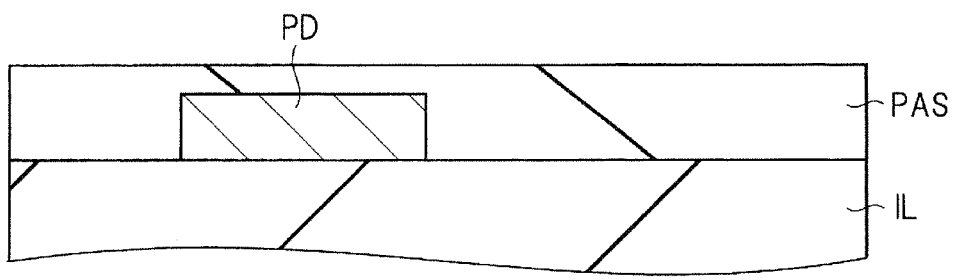
FIG. 9 is a sectional view showing the semiconductor device during a manufacturing process succeeding to FIG. 8.
Figure 10:
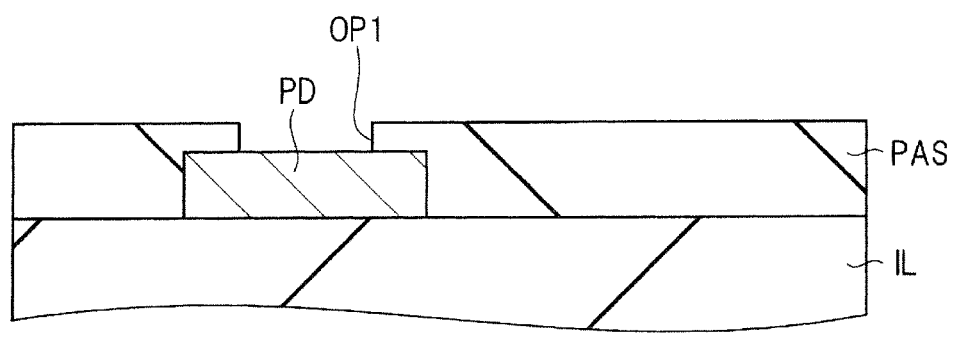
FIG. 10 is a sectional view showing the semiconductor device during a manufacturing process succeeding to FIG. 9.

Successively, as shown in FIG. 9, a surface protective film PAS is formed over the interlayer insulating film IL so as to cover the pad PD. The surface protective film PAS includes a silicon oxide film or a silicon nitride film for example and can be formed by a CVD (Chemical Vapor Deposition) method for example. Successively, as shown in FIG. 10, an opening OP1 is formed in the surface protective film PAS by a photolithography technology and an etching technology. On this occasion, a partial region of the pad PD is exposed at the bottom surface of the opening OP1.

Figure 11:
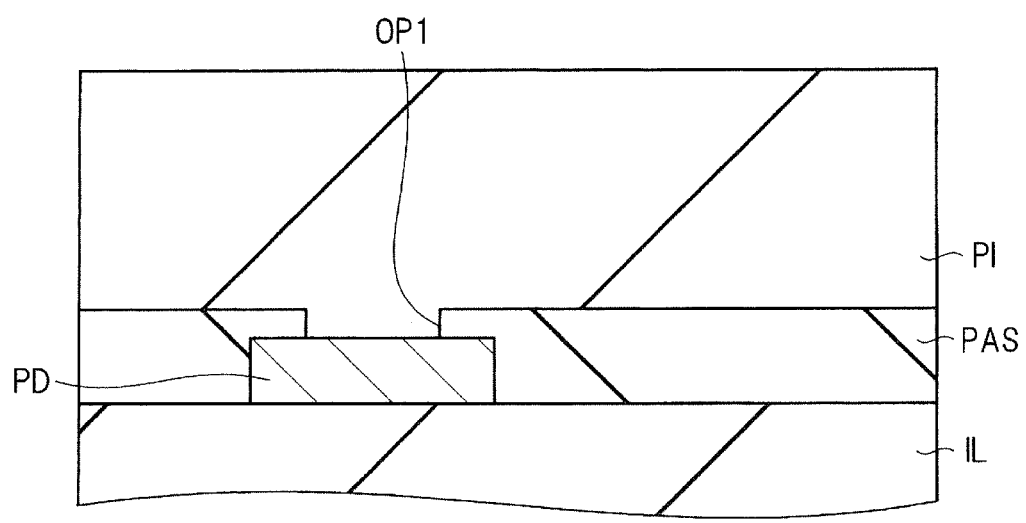
FIG. 11 is a sectional view showing the semiconductor device during a manufacturing process succeeding to FIG. 10.
Figure 12:
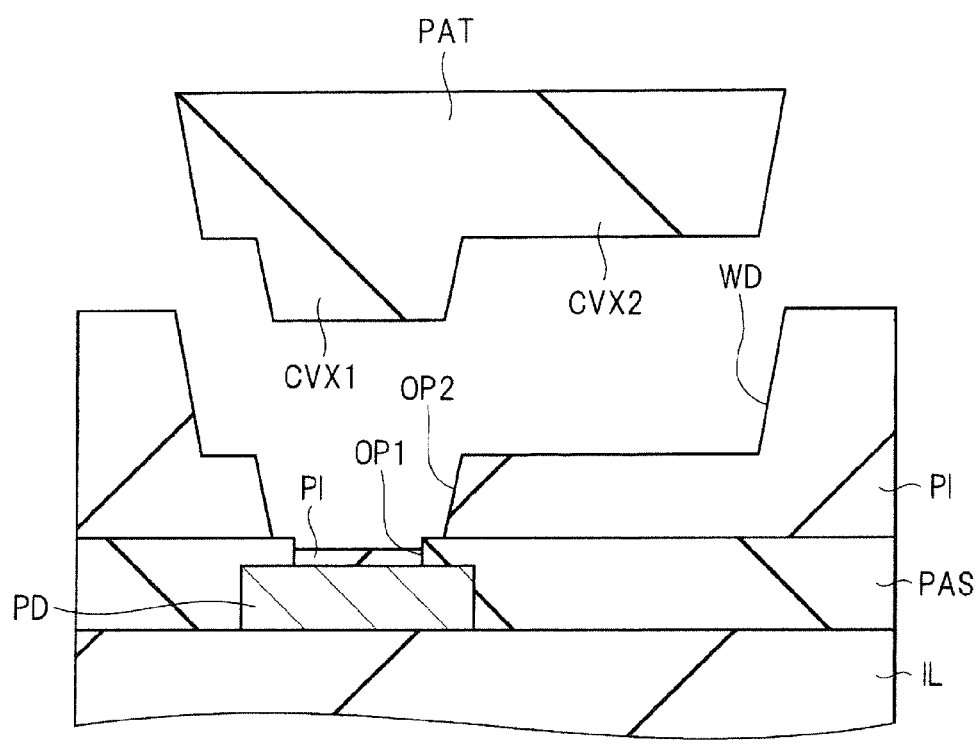
FIG. 12 is a sectional view showing the semiconductor device during a manufacturing process succeeding to FIG. 11.

Successively, as shown in FIG. 11, a polyimide resin film PI is formed over the surface protective film PAS in which the opening OP1 is formed. The polyimide resin film PI here is not necessarily photosensitive. Then as shown in FIG. 12, an opening OP2 and a redistribution layer gutter WD are formed integrally in the polyimide resin film PI by an imprinting technology. Concretely, a mold PAT in which a protrusion CVX1 and a protrusion CVX2 are formed is pressed to the polyimide resin film PI and the opening OP2 corresponding to the protrusion CVX1 and communicating with the opening OP1 and the redistribution layer gutter WD corresponding to the protrusion CVX2 and communicating with the opening OP2 are formed integrally in the polyimide resin film PI. On this occasion, as shown in FIG. 12, a tapered shape is formed in each of the protrusion CVX1 and the protrusion CVX2 of the mold PAT and resultantly the side surface of the opening OP2 formed in the polyimide resin film PI inclines so as to form a positive taper and the side surface of the redistribution layer gutter WD also inclines so as to form a positive taper. Here, a residue of the polyimide resin film PI remains over a surface region of the pad PD exposed through the opening OP1.

Figure 13:
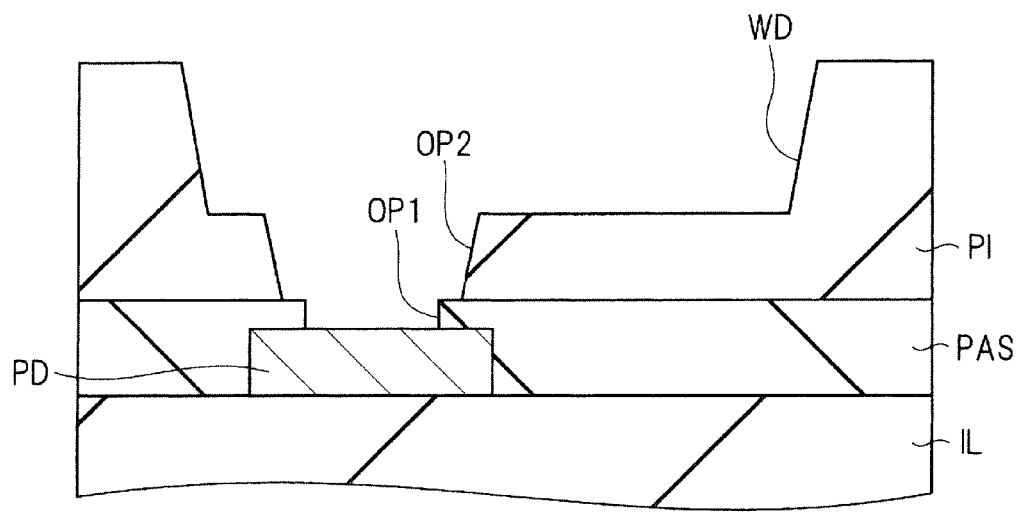
FIG. 13 is a sectional view showing the semiconductor device during a manufacturing process succeeding to FIG. 12.

Successively, the mold PAT is separated from the polyimide resin film PI and heat treatment (baking treatment) is applied to the polyimide resin film PI. As a result, the polyimide resin film PI in which the opening OP2 and the redistribution layer gutter WD are formed integrally hardens. Then as shown in FIG. 13, the residue of the polyimide resin film PI remaining over the surface of the pad PD is removed by an ashing technology with oxygen plasma. As a result, a part region of the surface of the pad PD is exposed at the bottom surface of the opening OP1.

Figure 14:
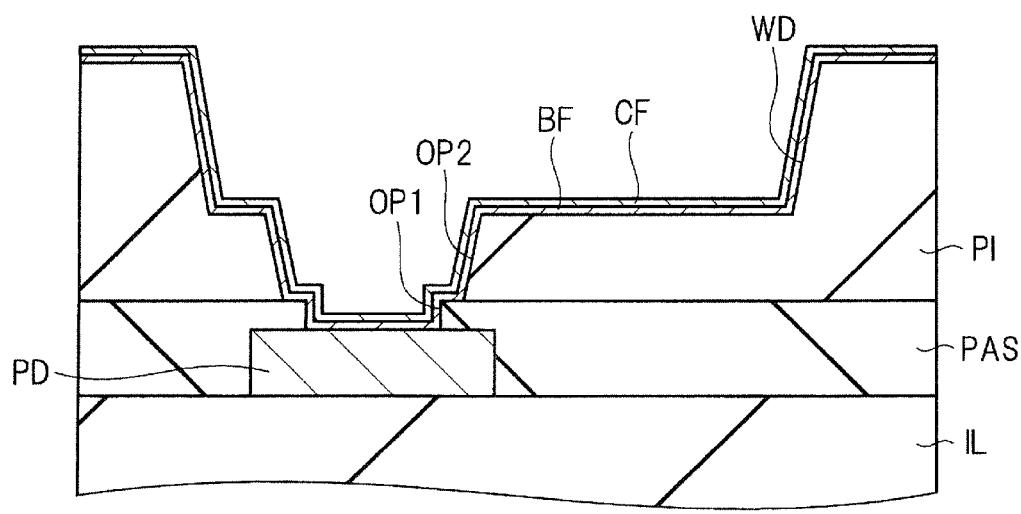
FIG. 14 is a sectional view showing the semiconductor device during a manufacturing process succeeding to FIG. 13.

Successively, as shown in FIG. 14, a barrier film BF is formed over the surface of the pad PD exposed through the opening OP1, the side surface of the opening OP1, the inner wall (bottom surface and side surface) of the opening OP2, the inner wall (bottom surface and side surface) of the redistribution layer gutter WD, and the surface of the polyimide resin film PI by a sputtering method. The barrier film BF includes a film having the function of inhibiting a wiring material including a redistribution layer from migrating into the polyimide resin film PI for example. Concretely, the barrier film BF can include a titanium film, a titanium nitride film, a titanium tungsten film, a chromium film, a tantalum film, a tungsten film, a tungsten nitride film a high-melting-point metal film, a precious metal film, or a combination of those.

Then an adhesive film CF is formed over the barrier film BF. The adhesive film CF includes a copper film or a copper alloy film, those containing copper as the main component, for example and can be formed by a sputtering method for example.

Figure 15:
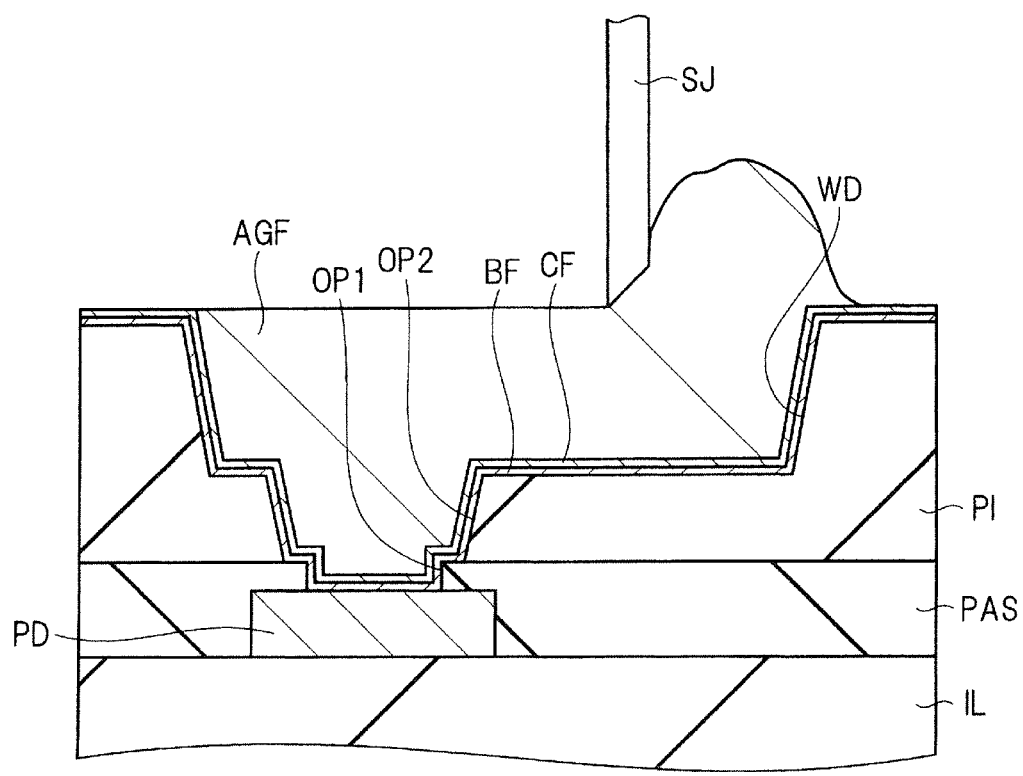
FIG. 15 is a sectional view showing the semiconductor device during a manufacturing process succeeding to FIG. 14.
Figure 16:
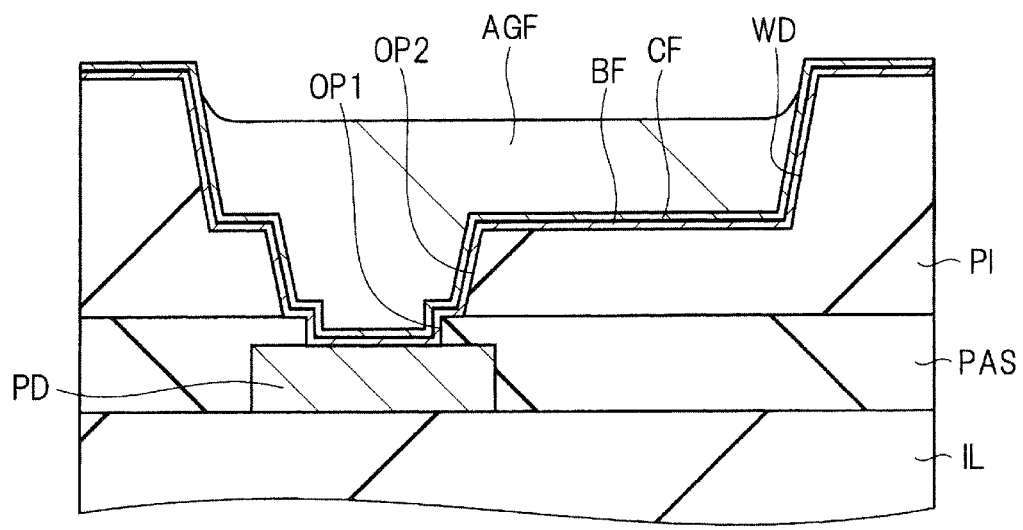
FIG. 16 is a sectional view showing the semiconductor device during a manufacturing process succeeding to FIG. 15.

Successively, as shown in FIG. 15, a silver paste PST is printed in the interiors of the opening OP1, the opening OP2, and the redistribution layer gutter WD with a squeegee SJ. Successively, as shown in FIG. 16, heating treatment (baking treatment) is applied to the silver paste PST. Through the heating treatment, a solvent contained in the silver paste PST is vaporized and thereby a silver film AGF is formed. Through the heat treatment at the time, the silver paste PST shrinks and thereby the height of the surface of the silver film AGF comes to be lower than the height of the surface of the polyimide resin film PI.

Figure 17:
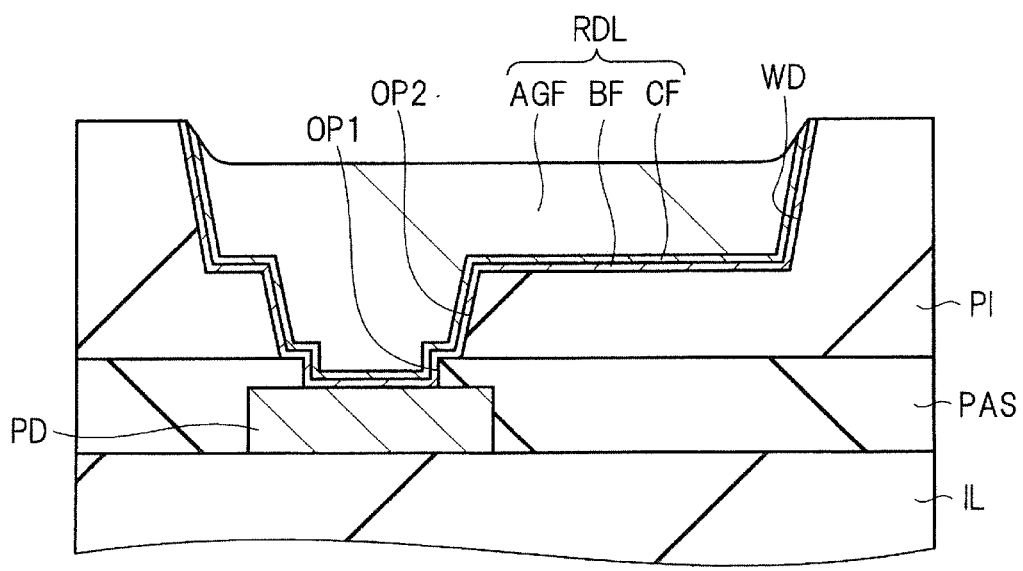
FIG. 17 is a sectional view showing the semiconductor device during a manufacturing process succeeding to FIG. 16.

Successively, as shown in FIG. 17, the adhesive film CF and the barrier film BF, those being exposed over the surface of the polyimide resin film PI, are removed. In this way, it is possible to form the redistribution layer structure according to First Embodiment including the barrier film BF, the adhesive film CF, and the silver film AGF.

<Features (Manufacturing Method) According to First Embodiment>

The first feature point of the manufacturing method of a semiconductor device according to First Embodiment stated above is, as shown in FIG. 12 for example, that an imprinting technology is used and thereby the opening OP2 and the redistribution layer gutter WD are formed integrally in the polyimide resin film PI. By the first feature pint of First Embodiment therefore, a photolithography technology (exposure/development treatment) may not be used for forming the opening OP2 and the redistribution layer gutter WD and hence it is possible to reduce the manufacturing cost.

Further, the second feature point of the manufacturing method of a semiconductor device according to First Embodiment is, as shown in FIG. 15 for example, that the silver film AGF that is to be a constituent film of the redistribution layer RDL is formed by an inexpensive printing technology. By the second feature pint of First Embodiment therefore, it is possible to: reduce the number of the manufacturing processes; and hence reduce the manufacturing cost of a semiconductor device. In this way, in the manufacturing method of a semiconductor device according to First Embodiment, by using simple imprinting technology and printing technology in place of a costly photolithography technology accompanying the forming of a mask and an exposure/development process, it is possible to: try to reduce the number of the processes; and thereby reduce the manufacturing cost of a semiconductor device. Moreover, in First Embodiment, the opening OP2 and the redistribution layer gutter WD are formed in the polyimide resin film PI by an imprinting technology. As a result, it is unnecessary to use a costly photosensitive polyimide resin film unlike the case of forming the opening OP2 and the redistribution layer gutter WD by a photolithography technology, it is possible to use an ordinary non-photosensitive polyimide resin film PI, and hence, from this viewpoint too, by the manufacturing method of a semiconductor device according to First Embodiment, it is possible to reduce the manufacturing cost of a semiconductor device.

In this way, First Embodiment has the first to seventh feature points as the feature points on the structure (device structure) and the first and second feature points as the feature points on the manufacturing method. From this, it is obvious that the technological thought according to First Embodiment is a technological thought having a very high usability on the point that it is possible to try to reduce a manufacturing cost significantly by reducing the number of processes significantly while the improvement of the reliability and versatility of a redistribution layer structure is materialized. That is, it can be said that the technological thought according to First Embodiment is exceptionally good in comparison with the related technology from the viewpoints of both the structure and the manufacturing method.

Modified Example

In First Embodiment stated earlier, explanations have been made on the basis of the case of forming an opening OP2 and a redistribution layer gutter WD integrally in a polyimide resin film PI as shown in FIG. 5 for example. On this occasion, it is possible to attain the advantage of expanding the degree of freedom in the structural design of the lower layer of a redistribution layer RDL. The technological thought according to First Embodiment however is not limited to the advantage and it is also possible to, for example as a modified example: not form an opening OP2 in a polyimide resin film PI but form only a redistribution layer gutter WD; and configure the redistribution layer gutter WD and an opening OP1 formed in a surface protective film PAS so as to communicate directly with each other. The configuration of the modified example is particularly useful when a measure of improving the mechanical strength of a surface protective film PAS is taken or when the film thickness of a surface protective film PAS is large.

Second Embodiment

Although explanations have been made on the basis of the case of using a silver film AGF as the wiring material of a redistribution layer RDL in First Embodiment stated earlier, explanations are made on the basis of the case of using a copper film CUF as the wiring material of a redistribution layer RDL in Second Embodiment. The device structure of a semiconductor device according to Second Embodiment has a configuration nearly identical to the device structure of a semiconductor device according to First Embodiment and hence the explanations will be made on the basis of the different points.

<Device Structure According to Second Embodiment>

Figure 18:
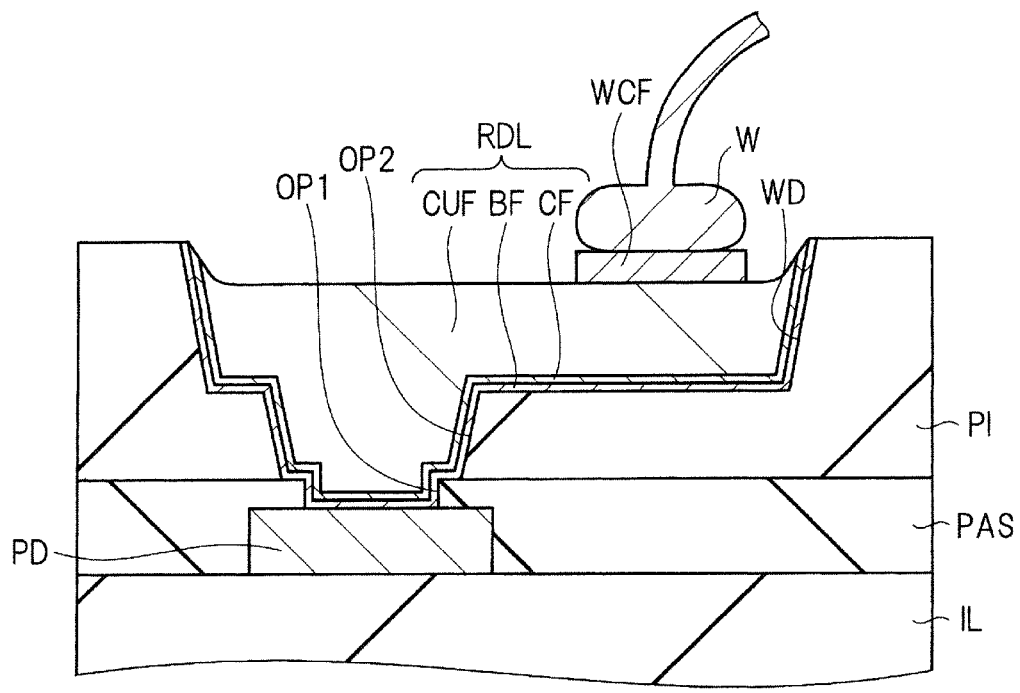
FIG. 18 is a schematic sectional view showing a device structure of a semiconductor device according to Second Embodiment.

FIG. 18 is a schematic sectional view showing the device structure of a semiconductor device according to Second Embodiment. In FIG. 18, a redistribution layer RDL includes a barrier film BF, an adhesive film CF, and a copper film CUF containing copper as the main component. Then a wire coupling conductive film WCF is formed over a partial region of the surface of the copper film CUF including the redistribution layer RDL and a wire W is coupled to the wire coupling conductive film WCF. Here, the wire coupling conductive film WCF can includes a silver film or a silver alloy film for example.

According to Second Embodiment, it is possible to reduce the manufacturing cost of a semiconductor device by configuring a redistribution layer RDL with an inexpensive copper film CUF. On the other hand, it is difficult for example to couple a wire W containing copper as the main component directly to a copper film CUF including a redistribution layer RDL from the viewpoint of adhesiveness and hence, in Second Embodiment, as shown in FIG. 18, a wire coupling conductive film WCF is formed over a copper wire CUF including a redistribution layer RDL and the redistribution layer RDL and a wire W are coupled to each other with the wire coupling conductive film WCF interposed. According to Second Embodiment too therefore, it is possible to improve the reliability of the coupling between the redistribution layer RDL and the wire W.

<Manufacturing Method of Semiconductor Device According to Second Embodiment

A semiconductor device according to Second Embodiment is configured as stated above and the manufacturing method of the semiconductor device is explained hereunder in reference to drawings.

Figure 19:
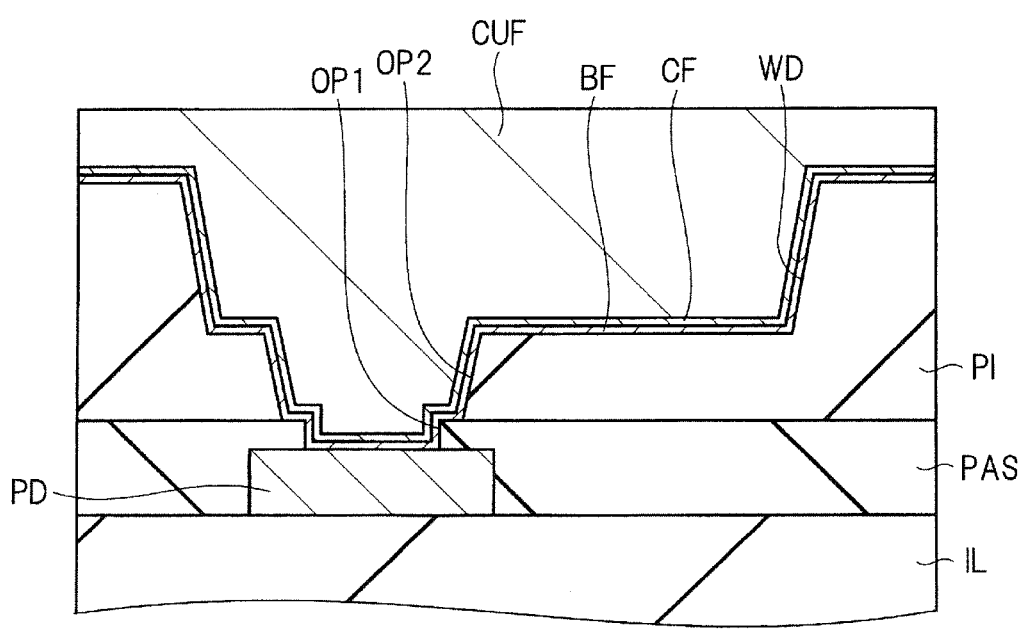
FIG. 19 is a sectional view showing a semiconductor device during a manufacturing process according to Second Embodiment.
Figure 20:
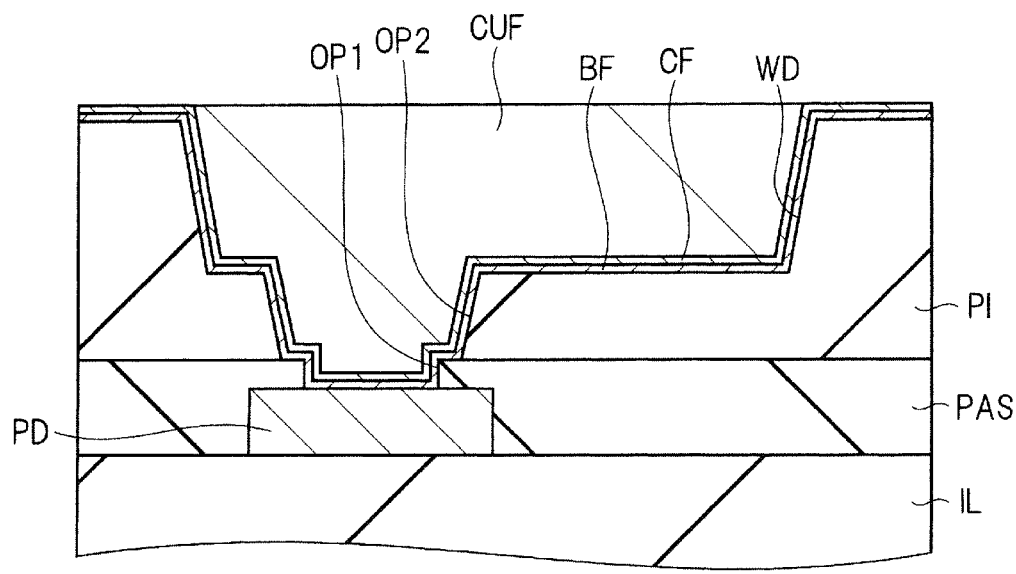
FIG. 20 is a sectional view showing the semiconductor device during a manufacturing process succeeding to FIG. 19.

Firstly, the processes of FIGS. 8 to 14 are identical to First Embodiment stated earlier. Successively, as shown in FIG. 19, a copper film CUF containing copper as the main component is formed over an adhesive film CF formed over a polyimide resin film PI so as to fill an opening OP1, an opening OP2, and a redistribution layer gutter WD. The copper film CUF can be formed by an electrolytic plating method for example. Successively, as shown in FIG. 20, the unnecessary copper film CUF formed over the polyimide resin film PI is polished and removed by a CMP (Chemical Mechanical Polishing) method for example. As a result, it is possible to embed the copper film CUF only into the opening OP1, the opening OP2, and the redistribution layer gutter WD. Here, although the copper film CUF is formed by the electrolytic plating method and the CMP method in Second Embodiment, Second Embodiment is not limited to that and it is also possible to form a copper film CUF by a printing method using a copper paste for example.

Figure 21:
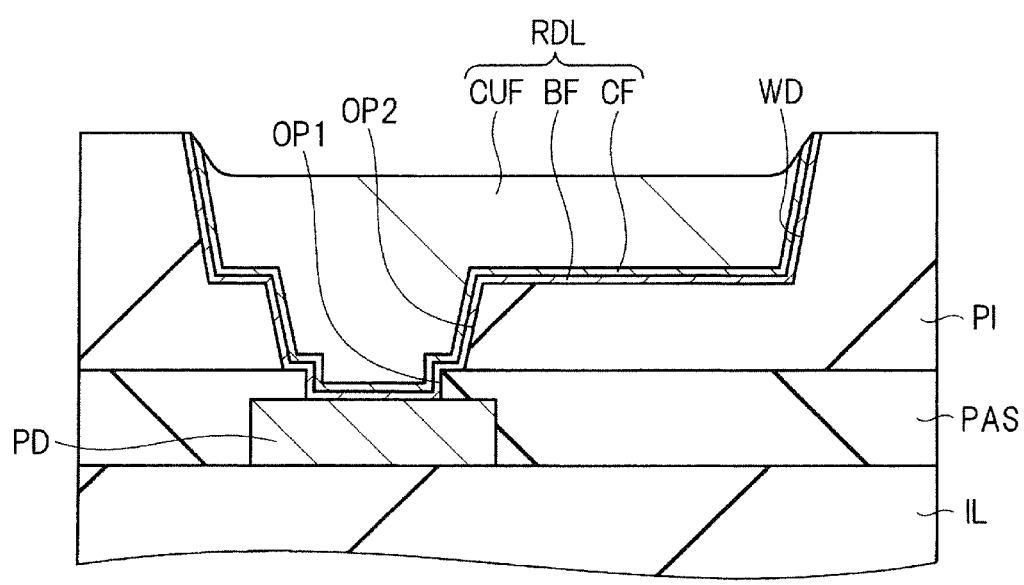
FIG. 21 is a sectional view showing the semiconductor device during a manufacturing process succeeding to FIG. 20.
Figure 22:
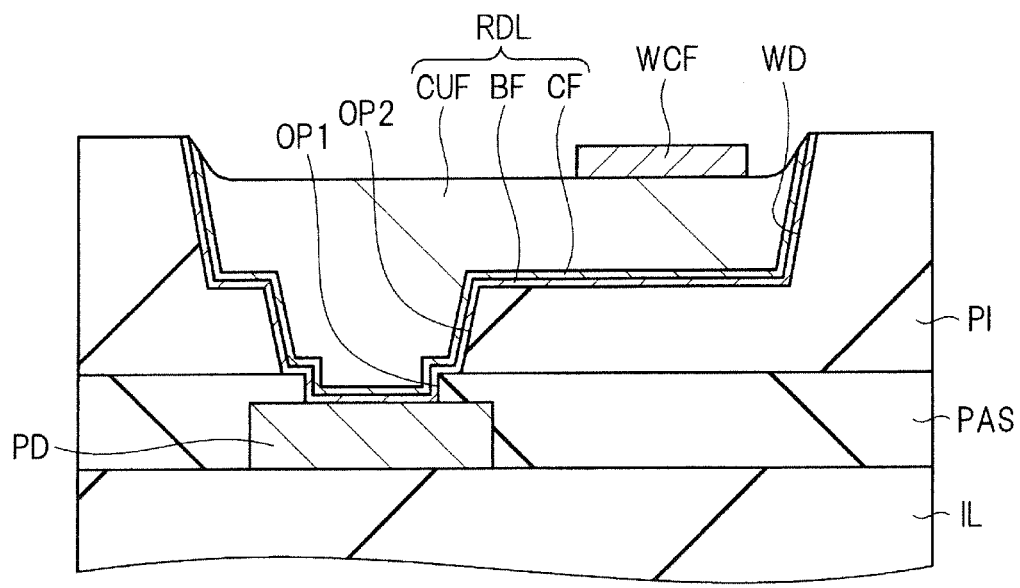
FIG. 22 is a sectional view showing the semiconductor device during a manufacturing process succeeding to FIG. 21.

Successively, as shown in FIG. 21, the adhesive film CF and a barrier film BF exposed through the polyimide resin film PI are removed by a wet etching method for example. On this occasion, the surface of the copper film CUF embedded into the redistribution layer gutter WD is also etched and the height of the surface of the copper film CUF comes to be lower than the height of the surface of the polyimide resin film PI. Successively, as shown in FIG. 22, a wire coupling conductive film WCF is formed over a partial region of the surface of the copper film CUF. The wire coupling conductive film WCF includes a silver film or a tin (Sn) film for example and can be formed by a printing method for example. Here, the manufacturing method of the wire coupling conductive film WCF is not limited to that and it is also possible to use a patterning technology involving a sputtering method and a photolithography technology for example. Successive processes are identical to First Embodiment stated earlier and, as shown in FIG. 18, a wire W containing copper as the main component is coupled to the wire coupling conductive film WCF for example. In this way, it is possible to manufacture a semiconductor device according to Second Embodiment.

Modified Example 1

Figure 23:
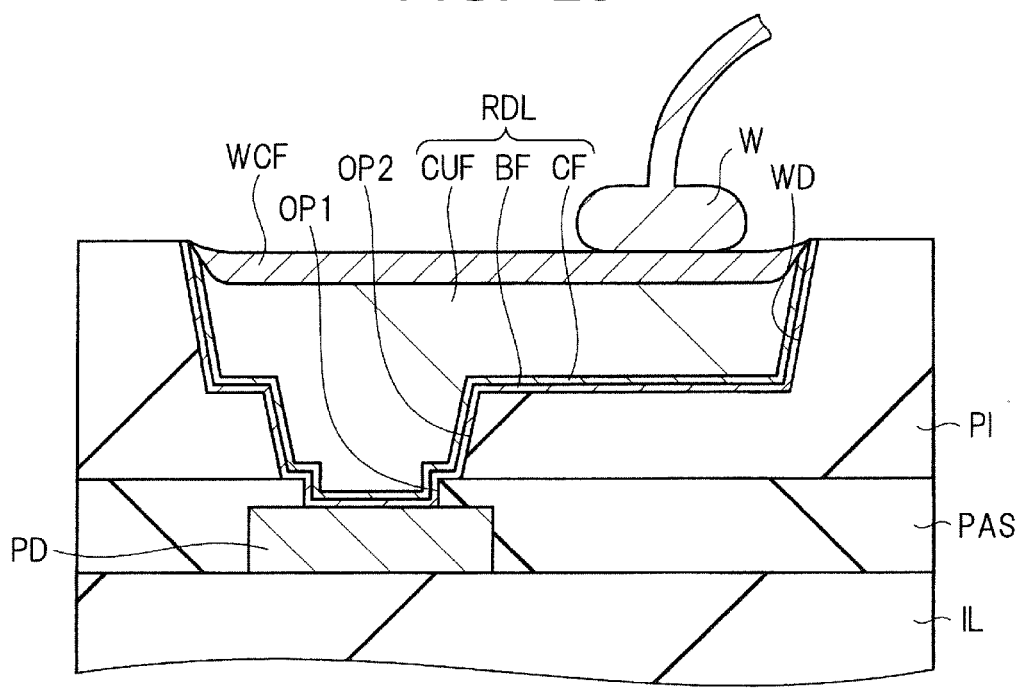
FIG. 23 is a sectional view schematically showing a redistribution layer structure according to Modified Example 1.

Modified Example 1 of Second Embodiment is explained hereunder. FIG. 23 is a sectional view schematically showing a redistribution layer structure according to Modified Example 1. As shown in FIG. 23, in Modified Example 1, a wire coupling conductive film WCF is formed over the whole surface of a copper film CUF including a redistribution layer RDL. On this occasion, it is possible to give flexibility to the coupling position of a wire W. On this occasion too, it is possible to form the wire coupling conductive film WCF by a printing method but the method is not limited to the method and it is also possible to use a non-electrolytic plating method for example.

Modified Example 2

Figure 24:
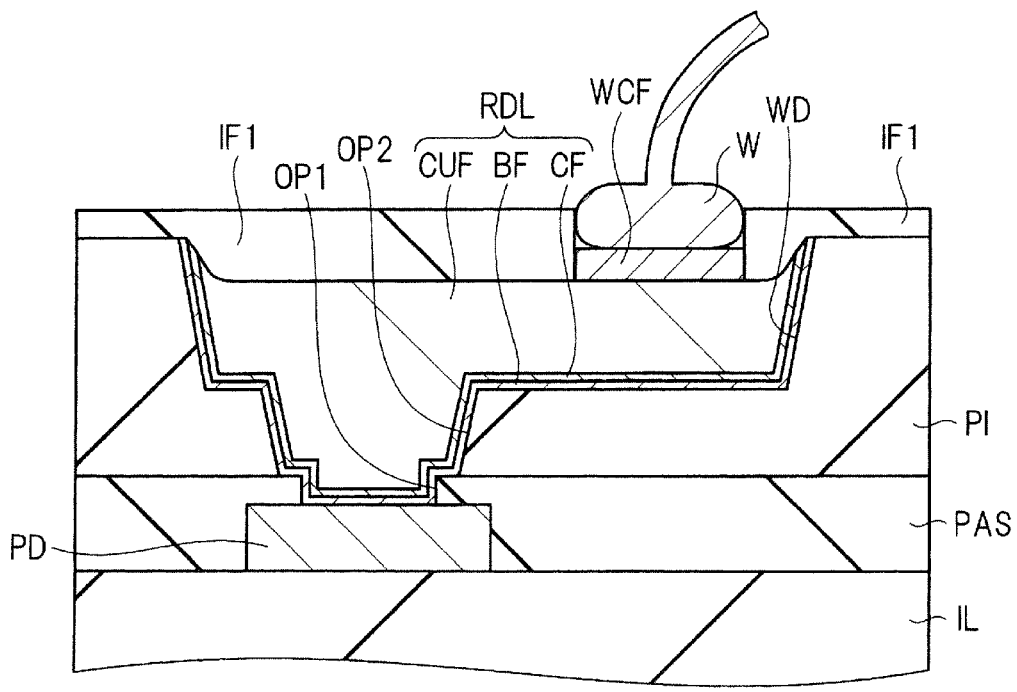
FIG. 24 is a sectional view schematically showing a redistribution layer structure according to Modified Example 2.

Modified Example 2 of Second Embodiment is explained hereunder. FIG. 24 is a sectional view schematically showing a redistribution layer structure according to Modified Example 2. As shown in FIG. 24, in Modified Example 2, a wire coupling conductive film WCF is formed over a partial region of the surface of a copper film CUF including a redistribution layer RDL and a wire W is coupled to the wire coupling conductive film WCF. Meanwhile, the region other than the partial region of the surface of the copper film CUF is covered with an insulating film IF1. As a result, it is possible to protect the surface of the redistribution layer RDL by the insulating film IF1 and it is also possible to obtain the effect of being able to inhibit shortage failure from being caused between redistribution layers RDL adjacent to each other by attaching a conductive foreign substance to the surface of a redistribution layer RDL.

The insulating film IF1 can include a polyimide resin film and can be formed by a printing method for example.

Modified Example 3

Figure 25:
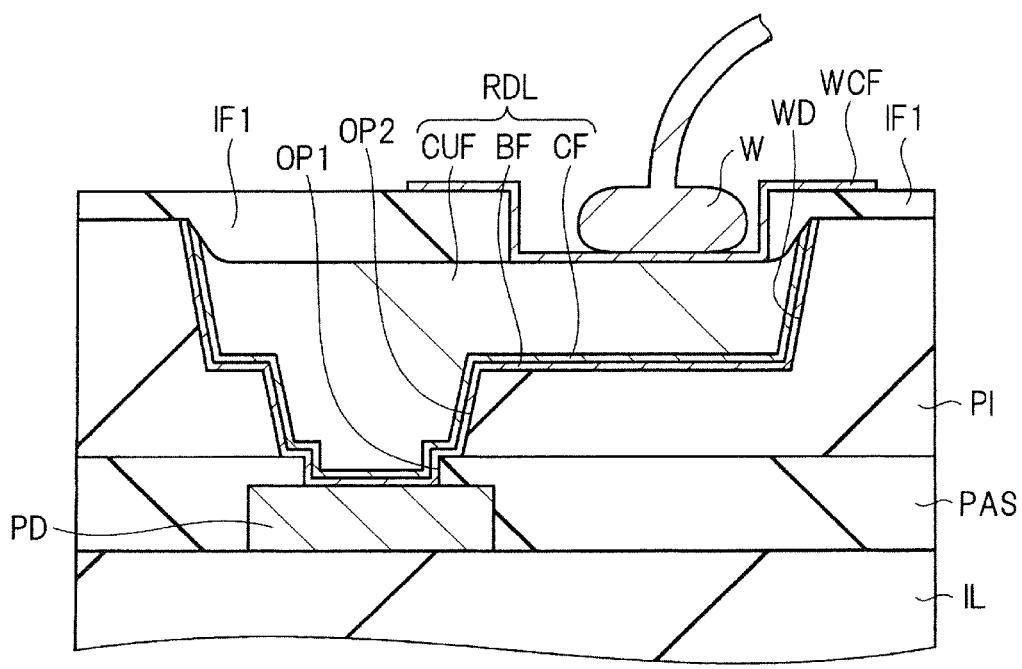
FIG. 25 is a sectional view schematically showing a redistribution layer structure according to Modified Example 3.

Modified Example 3 of Second Embodiment is explained hereunder. FIG. 25 is a sectional view schematically showing a redistribution layer structure according to Modified Example 3. As shown in FIG. 25, in Modified Example 3 too, like Modified Example 2, an insulating film IF1 is formed so as to cover the region other than a partial region of the surface of a copper film CUF including a redistribution layer RDL. Then in Modified Example 3, a wire coupling conductive film WCF is formed so as to extend over the partial region of the surface of the copper film CUF to a partial region of the insulating film IF1 and a wire W is coupled to the wire coupling conductive film WCF. On this occasion, the wire coupling conductive film WCF can be formed by a patterning technology involving a sputtering method and a photolithography technology for example.

Third Embodiment

Figure 26:
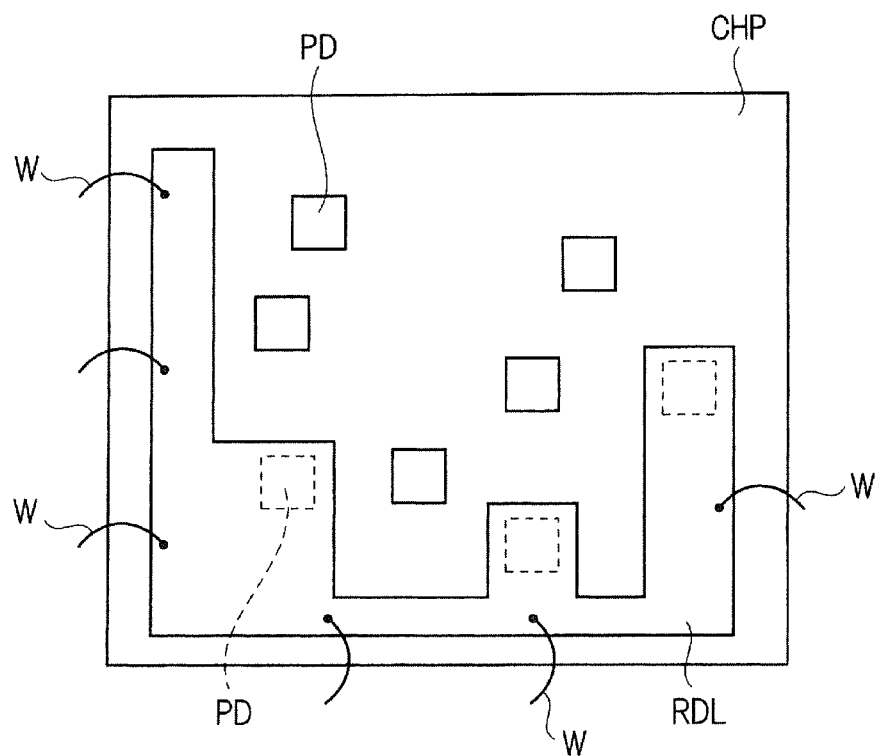
FIG. 26 is a view showing a schematic layout configuration of a semiconductor chip according to Third Embodiment.

In Third Embodiment, an application example of a redistribution layer structure explained in First Embodiment and Second Embodiment stated earlier is explained. FIG. 26 is a view showing a schematic layout configuration of a semiconductor chip CHP according to Third Embodiment. In FIG. 26, the semiconductor chip CHP according to Third Embodiment has a rectangular shape and a plurality of pads PD are formed in the inner region of the rectangular-shaped semiconductor chip CHP. Then as shown in FIG. 26, a redistribution layer RDL is formed so as to be coupled to some of the plural pads PD. By such a redistribution layer RDL, it is possible to couple wires W and the redistribution layer RDL in the peripheral region of the semiconductor chip CHP. That is, the redistribution layer RDL has the function of rearranging the positions where it is coupled to the wires W and by the rearrangement function of the redistribution layer RDL, it is possible to couple the wires W and the redistribution layer RDL in the peripheral region of the semiconductor chip CHP. Further, by realizing the rearrangement with a redistribution layer RDL having a width larger than the width of an internal wiring layer, it is possible to reduce the on resistance of the semiconductor chip CHP. Furthermore, it is possible to couple the redistribution layer RDL to a wire W at any position of the redistribution layer RDL and hence it is possible to materialize the flexibility of the connecting position of the wire W. This means that it is possible to mount an identical semiconductor chip CHP in various package forms by using a redistribution layer RDL according to Third Embodiment and it is thereby possible to enhance the versatility of the semiconductor chip CHP.

Modified Example 1

Figure 27:
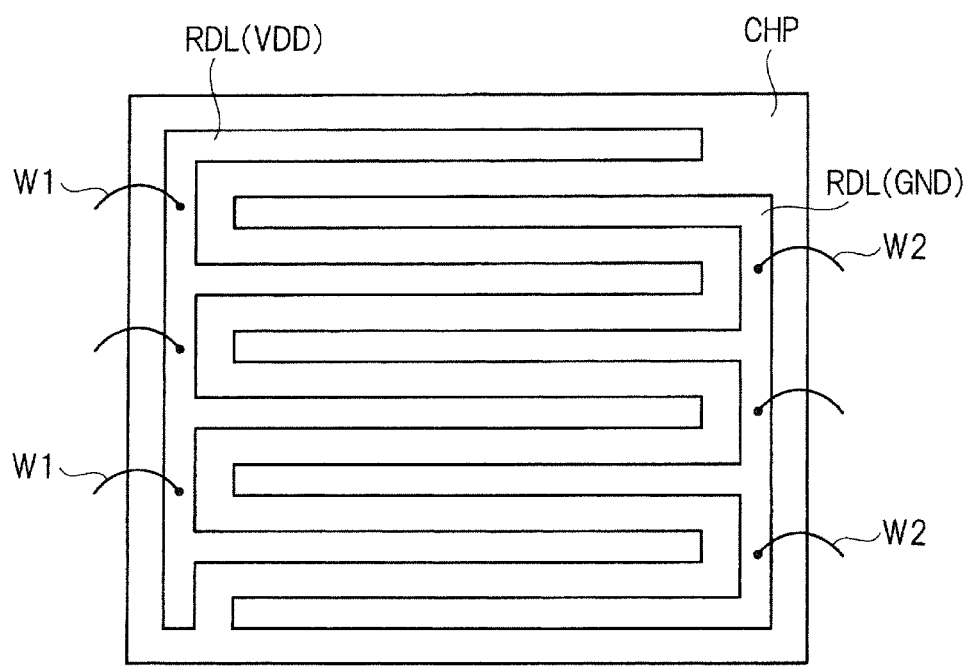
FIG. 27 is a view showing a schematic layout configuration of a semiconductor chip according to Modified Example 1.

FIG. 27 is a view showing a layout configuration of a semiconductor chip CHP according to Modified Example 1. In Modified Example 1, an example where rearrangement conforming to a package shape is carried out with redistribution layers is shown in FIG. 27. Concretely, it is possible to try to strengthen a power source line by bundling lines through which a power source potential is supplied with a redistribution layer RDL(VDD) for example. Likewise, it is possible to try to strengthen a ground line by bundling lines through which a reference potential (GND potential) is supplied with a redistribution layer RDL(GND) for example. Further, as shown in FIG. 27, pad-free is materialized by the redistribution layer RDL(VDD) and the redistribution layer RDL(GND), the degree of freedom in coupling wires W1 and wires W2 increases, and resultantly it is possible to reduce the number of pins in a semiconductor device. Furthermore, according to Modified Example 1, it is possible to: couple a plurality of wires W1 to the redistribution layer RDL(VDD); and hence try to reduce the resistance of a power source line. Likewise, according to Modified Example 1, it is possible to: couple a plurality of wires W2 to the redistribution layer RDL(GND); and hence try to reduce the resistance of a ground line.

Modified Example 2

Figure 28:
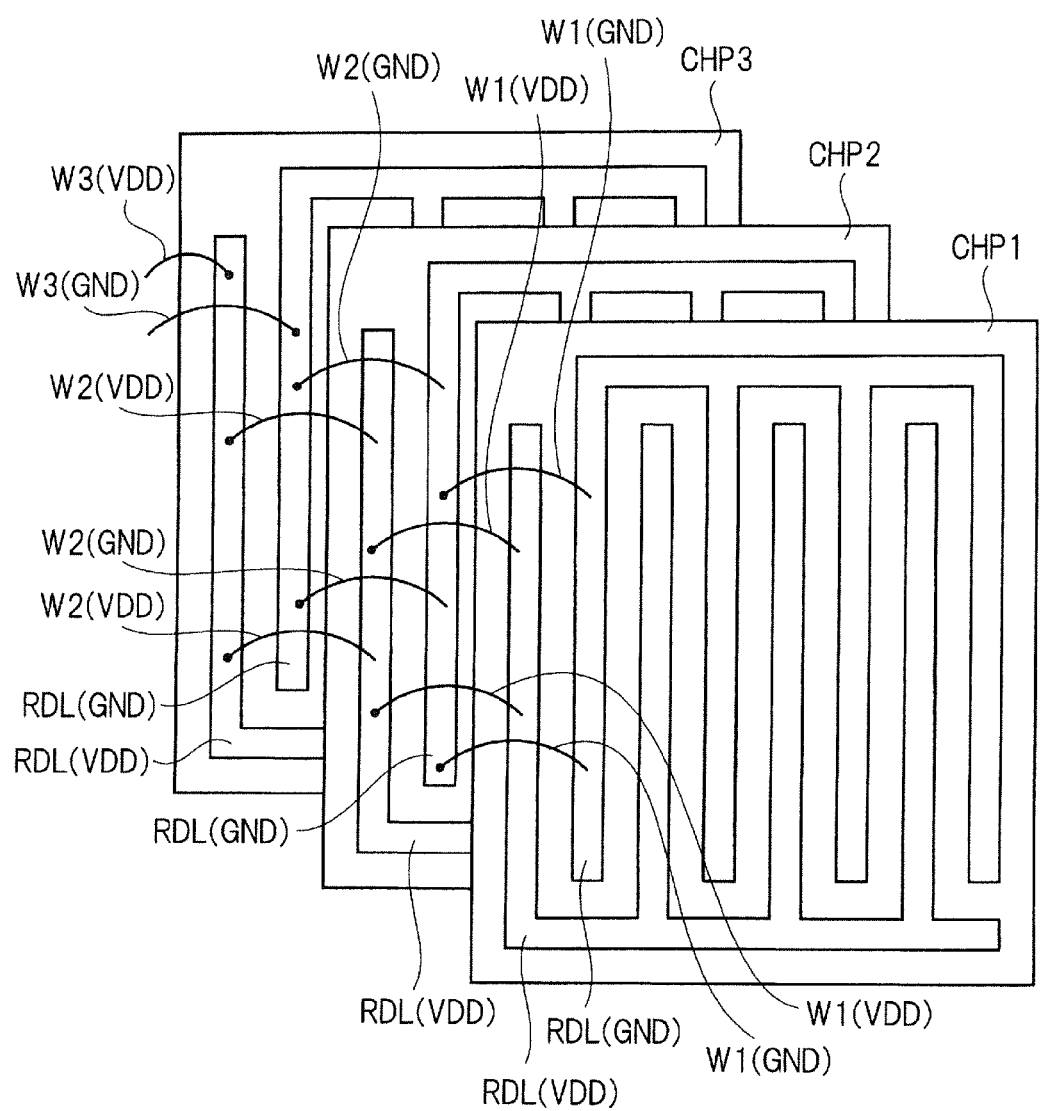
FIG. 28 is a view showing a schematic layout configuration of a laminated semiconductor chip according to Modified Example 2.

FIG. 28 is a view showing the layout configuration of a laminated semiconductor chip according to Modified Example 2. In Modified Example 2, an example of arranging semiconductor chips CHP1 to CHP3 in which redistribution layer structures are formed in layers is shown in FIG. 28. Concretely, a redistribution layer RDL(VDD) through which a power source potential is supplied and a redistribution layer RDL(GND) through which a reference potential is supplied are arranged in the semiconductor chip CHP1. Likewise, a redistribution layer RDL(VDD) through which a power source potential is supplied and a redistribution layer RDL(GND) through which a reference potential is supplied are arranged also in the semiconductor chip CHP2 and a redistribution layer RDL(VDD) through which a power source potential is supplied and a redistribution layer RDL(GND) through which a reference potential is supplied are arranged also in the semiconductor chip CHP3. Then as shown in FIG. 28, the redistribution layer RDL(VDD) of the semiconductor chip CHP1 and the redistribution layer RDL (VDD) of the semiconductor chip CHP2 are coupled with a wire W1(VDD) and the redistribution layer RDL(GND) of the semiconductor chip CHP1 and the redistribution layer RDL(GND) of the semiconductor chip CHP2 are coupled with a wire W1(GND). Likewise, the redistribution layer RDL(VDD) of the semiconductor chip CHP2 and the redistribution layer RDL(VDD) of the semiconductor chip CHP3 are coupled with a wire W2(VDD) and the redistribution layer RDL(GND) of the semiconductor chip CHP2 and the redistribution layer RDL(GND) of the semiconductor chip CHP3 are coupled with a wire W2(GND). Further, the redistribution layer RDL(VDD) of the semiconductor chip CHP3 and a wire W3(VDD) are coupled and the redistribution layer RDL(GND) of the semiconductor chip CHP3 and a wire W3(GND) are coupled.

In this way, a redistribution layer structure according to Modified Example 2 is applicable also to a semiconductor device in which semiconductor chips CHP1 to CHP3 are arranged in layers for example. That is, a redistribution layer structure according to Modified Example 2 is applicable also to a semiconductor device of COC (Chip On Chip).

More specifically, it is possible to form a redistribution layer structure also over the bottom surface of a semiconductor chip by an identical manufacturing method and hence, by the technological thought in Third Embodiment including Modified Example 1 and Modified Example 2, the advantage of being capable of forming the structure of a semiconductor chip suitable for an SIP (System In Package) and a 3D-PKG at a level comparable to a semiconductor wafer can be obtained at a low cost. Further, a redistribution layer structure according to Third Embodiment including Modified Example 1 and Modified Example 2 is applicable as the wiring for a passive element integrated chip (IPD) or a MEMS chip. Here, although explanations have been made on the basis of a configuration example where a wire W is coupled to a redistribution layer RDL in Embodiments 1 to 3, a redistribution layer structure explained in Embodiments 1 to 3 is applicable not only to coupling to a wire W but also to flip chip coupling using a bump electrode.

Although the invention established by the present inventors has heretofore been explained concretely on the basis of the embodiments, it goes without saying that the present invention is not limited to the embodiments and can be modified variously within the scope not departing from the tenor of the present invention.

What is claimed is:

1. A manufacturing method of a semiconductor device including the processes of: (a) preparing a semiconductor substrate over which a pad and a surface protective film covering the pad and having a first opening exposing a part of the surface of the pad are formed; (b) forming a protective insulating film over the surface protective film including the interior of the first opening; (c) by pressing a mold in which a first protrusion and a second protrusion are formed to the protective insulating film, integrally forming a second opening corresponding to the first protrusion and communicating with the first opening and a wiring layer gutter corresponding to the second protrusion and communicating with the second opening in the protective insulating film; and (d) forming a wiring layer in the interior of the wiring layer gutter.

2. A manufacturing method of a semiconductor device according to claim 1,
wherein the manufacturing method includes the processes of: between the process (c) and the process (d), (e) forming a barrier film to inhibit a wiring material including the wiring layer from migrating into the protective insulating film over the surface of the pad exposed through the first opening, the side surface of the first opening, the inner wall of the second opening, and the protective insulating film; and after the process (d), (f) removing the barrier film formed over the protective insulating film.

3. A manufacturing method of a semiconductor device according to claim 1,
wherein the process (d) includes the processes of: (d1) printing the wiring material of the wiring layer in the interior of the wiring layer gutter; and (d2) applying heat treatment to the wiring material.

4. A manufacturing method of a semiconductor device according to claim 1,
wherein the manufacturing method includes the processes of, between the process (c) and the process (d): (g) separating the mold from the protective insulating film; and (h) applying heat treatment to the protective insulating film after the process (g).

* * * * *